US 6,707,230 B2

(12) United States Patent
Smith et al.

(10) Patent No.: US 6,707,230 B2
(45) Date of Patent: Mar. 16, 2004

(54) CLOSED LOOP CONTROL SYSTEMS EMPLOYING RELAXOR FERROELECTRIC ACTUATORS

(75) Inventors: Stuart T. Smith, Charlotte, NC (US); Shane C. Woody, Charlotte, NC (US); Richard M. Seugling, Charlotte, NC (US)

(73) Assignee: University of North Carolina at Charlotte, Charlotte, NC (US)

( * ) Notice: Subject to any disclaimer, the term of this patent is extended or adjusted under 35 U.S.C. 154(b) by 0 days.

(21) Appl. No.: 10/157,095

(22) Filed: May 29, 2002

(65) Prior Publication Data

US 2003/0006676 A1 Jan. 9, 2003

Related U.S. Application Data

(60) Provisional application No. 60/293,900, filed on May 29, 2001.

(51) Int. Cl.$^7$ .............................................. H01L 41/08
(52) U.S. Cl. ................ 310/316.01; 310/321; 310/326; 310/328; 310/330; 310/358
(58) Field of Search ........................... 310/316.01, 317, 310/319, 330–332, 328, 357–359, 321, 326

(56) References Cited

U.S. PATENT DOCUMENTS

| 4,435,666 A | * | 3/1984 | Fukui et al. ................. 310/328 |
| 4,663,555 A | * | 5/1987 | Yoshihiro .................... 310/317 |
| 4,721,447 A | * | 1/1988 | Erckmann .................... 425/141 |
| 4,742,261 A | * | 5/1988 | Rich et al. ................... 310/328 |
| 5,043,621 A | * | 8/1991 | Culp ....................... 310/316.02 |
| 5,365,140 A | * | 11/1994 | Ohya et al. ................. 310/328 |
| 5,424,596 A | * | 6/1995 | Mendenhall et al. ....... 310/328 |
| 5,511,931 A | * | 4/1996 | Arai et al. .................. 414/680 |
| 5,821,671 A | * | 10/1998 | Trzmiel ....................... 310/328 |
| 5,998,910 A | | 12/1999 | Park et al. .................. 310/358 |
| 6,048,394 A | | 4/2000 | Harmer et al. ................. 117/8 |
| 6,340,858 B1 | * | 1/2002 | Jaenker ....................... 310/328 |
| 6,420,819 B1 | * | 7/2002 | Lazarus et al. ............. 310/330 |

(List continued on next page.)

OTHER PUBLICATIONS

Seung–Eek Eagle Park et al., "High Performance single crystal piezoelectrics: applications and issues", *Current Opinions in Solid State and Materials Science*, (2002), pps. 11–18.

Seung–Eek Park et al., "Ultrahigh strain and piezoelectric behavior in relaxor based ferroelectric single crystals", *J. Appl. Phys.* 82 (4), 1997, pps. 1804–1811.

Standards Committee, "IEEE Standard Definitions of Terms Associated with Ferroelectric and Related Materials", Draft 14, Aug. 14, 2002, pps. 1–78.

Fanning, "Structure Property Relations in Ferroelectric Materials", Thesis for University of Illinois at Urbana–Champaign (2000), 158 pages.

*Primary Examiner*—Mark Budd
(74) *Attorney, Agent, or Firm*—Kennedy Covington Lobdell & Hickman, LLP

(57) ABSTRACT

A closed loop motion control system employing at least one relaxor actuator which controls the position of a moving member having mass by controlling an electric field applied to the relaxor actuator. The actuator comprises a body of relaxor material dimensionally variable under the influence of the electric field applied in the form of a voltage to electrodes on at least two surfaces of the actuator. The voltage is applied in response to a feedback signal produced by at least one feedback sensor, which may be a displacement sensor or some other type of sensor. Thus, by constantly monitoring the displacement or other variable of the actuator device, the position of the moving member may be precisely controlled.

67 Claims, 13 Drawing Sheets

U.S. PATENT DOCUMENTS

| | | |
|---|---|---|
| 2001/0001258 A1 | 5/2001 | Ishigaki et al. .............. 361/502 |
| 2001/0013510 A1 | 8/2001 | Wiener-Avnear et al. ...................... 219/121.69 |
| 2001/0019037 A1 | 9/2001 | Zakhidov ...................... 216/56 |
| 2001/0032382 A1 | 10/2001 | Lorraine et al. ............ 29/25.35 |
| 2001/0035896 A1 | 11/2001 | Silverbrook et al. ........... 347/54 |
| 2001/0039317 A1 | 11/2001 | Scheinbeim ................. 526/253 |
| 2001/0043253 A1 | 11/2001 | Silverbrook .................. 347/54 |
| 2001/0045969 A1 | 11/2001 | Silverbrook .................. 347/11 |
| 2001/0050514 A1 | 12/2001 | Gururaja ...................... 310/320 |
| 2002/0000896 A1 | 1/2002 | Phillips, Jr. et al. ......... 333/185 |
| 2002/0005877 A1 | 1/2002 | Silverbrook .................. 347/54 |
| 2002/0011300 A1 | 1/2002 | Cass ....................... 156/89.12 |
| 2002/0021331 A1 | 2/2002 | Silverbrook et al. ........... 347/54 |
| 2002/0027400 A1 | 3/2002 | Toda .......................... 310/334 |
| 2002/0036282 A1 | 3/2002 | Chiang ....................... 252/62.9 |
| 2002/0039000 A1 | 4/2002 | Shirakawa et al. .......... 313/506 |
| 2002/0040887 A1 | 4/2002 | Silverbrook et al. ........... 216/27 |
| 2002/0041147 A1 | 4/2002 | Shirakawa .................. 313/498 |
| 2002/0042577 A1 | 4/2002 | Hatangadi et al. ........... 600/459 |

Fig. 13A
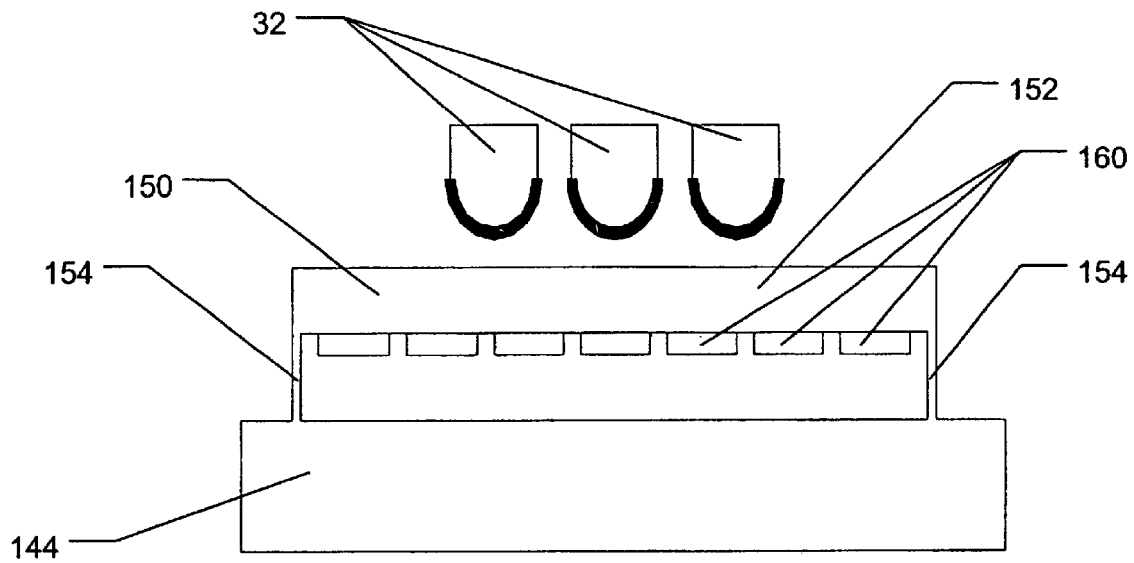
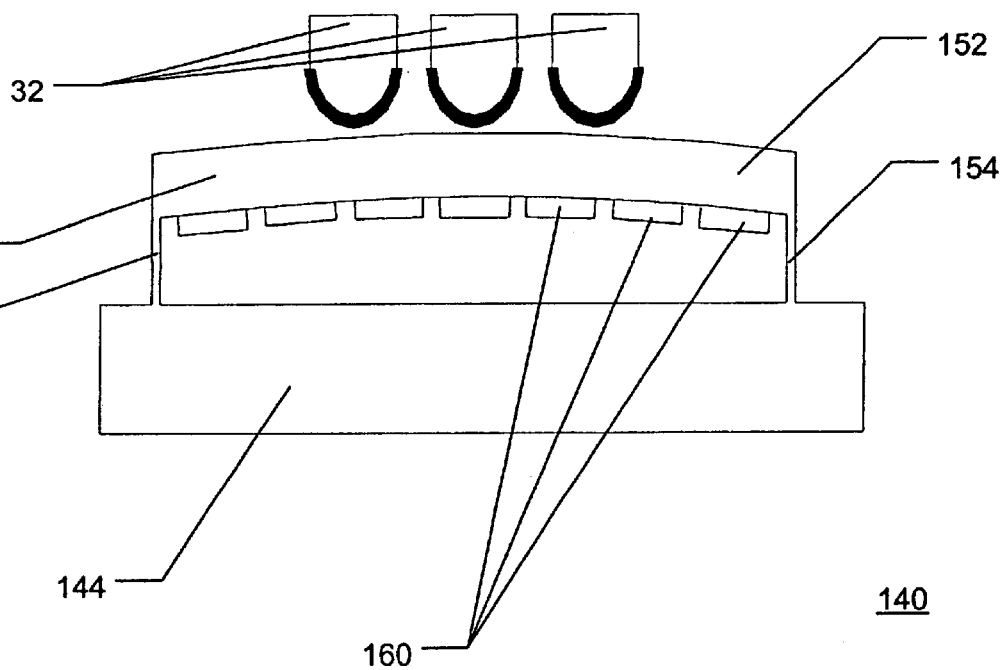
Fig. 13B

CLOSED LOOP CONTROL SYSTEMS EMPLOYING RELAXOR FERROELECTRIC ACTUATORS

CROSS-REFERENCE TO RELATED APPLICATION

This application is entitled to the benefit of, and claims priority to, provisional U.S. patent application Ser. No. 60/293,900 filed May 29, 2001 and entitled "RELAXOR FERROELECTRIC CRYSTALS FOR POSITIONING ACTUATORS WITH CLOSED LOOP CONTROL," the entirety of which is hereby incorporated by reference.

FIELD OF THE PRESENT INVENTION

The present invention relates generally to the field of precision motion control systems, and, in particular, to the use of relaxor ferroelectric material-based piezoelectric actuators in a closed loop motion control system.

BACKGROUND OF THE PRESENT INVENTION

Traditional piezoelectric ceramics such as $Pb(Zr_{1-x}Ti_x)O_3$ ("PZT") are currently the material of choice and the mainstream for high performance actuator applications. PZT ceramics are of a morphotropic phase boundary ("MPB") composition. As a result of polarizability, MPB compositions demonstrate high dielectric and piezoelectric characteristics. Consequently, PZT with MPB compositions will typically generate up to 0.2% strain levels with electric fields up to 40 kV/cm, as illustrated in FIG. 1. However, the PZT compositions will typically breakdown as electric fields are increased above 40–50 kV/cm. In addition, morphotropic PZT material exhibits significant hysteresis as it expands and retracts. FIG. 2 is a graphical illustration of a typical hysteretic curve of morphotropic PZT material without the use of the closed loop control system of the present invention.

Recent developments have established that relaxor-based single crystals possess enhanced performance characteristics compared to alternative polycrystalline forms. For example, in U.S. Pat. No. 5,998,910 to Park et al. ("the '910 patent"), single crystals of $Pb(Mg_{1/3}Nb_{2/3})O_3$ ("PMN"), $Pb(Zn_{1/3}Nb_{2/3})O_3$ ("PZN"), and their solid solutions with $PbTiO_3$ ("PT") have been shown to exhibit electric field induced strains greater than 1%, longitudinal coupling coefficients ($k_{33}$) greater than 90, piezoelectric coefficients ($d_{33}$) greater than 2000 pc/N, and dielectric constants from 1000–5000 with low dielectric loss (less than 1%). FIG. 1 is a graphical representation comparing the relationship between the strain and electric field behavior for various crystals of PZN-PT and PMN-PT to that of various electromechanical ceramics. As illustrated, the relaxor crystals defined in the '910 patent maintain higher strain rates, and the dielectric properties of these materials collectively demonstrate great potential for expanding existing actuator applications.

The new capability opened up by these new materials makes them ideally suited for small to medium scale engineering applications, often referred to as "meso-scale" systems. Meso-scale systems incorporate mechanisms such as the components in a mechanical watch, the small suspensions for supporting magnetic read heads in computer disc drives, miniature systems for minimally-invasive medical procedures, and many others. Although traditional piezoelectric materials such PZT have long been used to provide precise motion control, their applicability to meso-scale systems has always been very limited because their limited strains make the materials much less effective when used to drive motions of more than a small fraction of a millimeter. Lever mechanisms may be used to increase the range of traditional piezo-electric materials, but the resulting actuators have limited load bearing capacity, are bulky and have a low dynamic response.

By comparison, the large strains of which the relaxor materials are capable make it possible to produce actuators that potentially allow sub-nanometer resolution over ranges on the order of millimeters or more using only a single device, rather than through the combination of multiple devices. This in turn would enable the realization of motion control systems with motions ranging from micro-scale (micrometers or even nanometers) to meso-scale (tens of micrometers to millimeters), enabling the development of entire new families of applications.

Unfortunately, hysteresis continues to be observed for relaxor ferroelectric materials. FIG. 3 is a graphical illustration of a typical hysteretic curve of morphotropic PZN material without the use of the closed loop control system of the present invention. Although the hysteretic response of the PZN material is reduced as compared to that of some traditional piezoelectric materials, it is clearly not eliminated, as evidenced in FIG. 3. As is well known, hysteresis has a number of detrimental effects, including significant imprecision. This, combined with variations in the response of the material with temperature, self-heating (particularly at high frequencies), and other problems significantly limit the otherwise beneficial effects of actuators formed from relaxor materials. Thus, a need exists for a means for minimizing the hysteretic and other undesirable effects in relaxor actuators, thereby improving their precision and accuracy.

Existing applications for relaxor actuators, which include the incorporation of relaxor materials in ink-jet printer heads as well as ultrasonic and sonar applications, fail to meet this need. None of these applications involves the measurement of displacements for motion control. Instead, in each of these applications, relaxor materials are utilized because of the very high strains that are possible and because they can deliver a relatively high power density for enhancing signal levels in sonar, ink jet pressures/performance, and ultrasonic intensities. Thus, it is sufficient to operate known relaxor actuators in open-loop mode.

SUMMARY OF THE INVENTION

It is an object of the present invention to provide a system to enhance motion and positioning of relaxor actuators by applying these type materials to closed-loop control systems.

It is a further object of the present invention to improve upon the precision and accuracy of positioning of meso-scale systems.

Still other objectives and advantages of the invention will in part be obvious and will in part be apparent from the specification.

The invention accordingly comprises the features of construction, combinations of elements, and arrangement of parts, which will be exemplified in the construction hereinafter set forth, and the scope of the invention will be indicated in the claims.

To these ends, the present invention provides an apparatus for controlling precision motion with relaxor actuators using dynamic control. The servo system utilizes a feed back signal to maintain precise motion control and measures relative displacements or rotations of component parts of the mechanism. Broadly defined, an electromechanical actuator system according to one embodiment of the present invention includes: at least one actuator device having an actuator body formed from a relaxor-based piezoelectric material and a mechanical system driven by the actuator body; a sensor for sensing a phenomenon produced by the mechanical system in response to piezoelectric movement of the actuator body; and a driver, having an input connected to the sensor, for applying a variable electric field to the actuator body.

In features of this aspect, the sensor produces an output corresponding to the phenomenon produced by the mechanical system, and the driver applies the electric field in response to the sensor output; piezoelectric movement of the actuator body causes a first surface to move relative to a second surface, the sensor measures the separation between the first and second surfaces, and the output of the sensor is a function of the separation measurement; the sensor measures the separation between a point on the first surface and a point on the second surface; the first surface defines a first plane and the second surface defines a second plane, and the sensor measures the separation between the first plane and the second plane; the piezoelectric movement of the actuator body defines a direction of movement, and the direction of movement intersects the first and second surfaces; the actuator body defines a central axis parallel to the direction of piezoelectric movement, and the central axis intersects the first and second surfaces; the magnitude of the piezoelectric movement of the actuator body is substantially equivalent to the magnitude of change caused by the piezoelectric movement in the separation between the first and second surfaces; the sensor is disposed generally adjacent to the actuator body; the mechanical system includes a first moving member in direct physical contact with the actuator body, the area of contact generally defines a first location in the mechanical system, and the movement of the first surface relative to the second surface occurs in a second location in the mechanical system; the mechanical system includes a lever, and the movement of the first surface relative to the second surface is transmitted from the actuator body via the lever; the phenomenon produced by the mechanical system is a displacement; the displacement is the displacement of at least a portion of the mechanical system; and the displacement is a linear or rotational displacement.

In other features of this aspect, the sensor is a proximity probe; the sensor is a strain gage; the sensor detects a phenomenon other than displacement; the system further includes a comparator for comparing the sensor output to a signal representing a desired state; the system further includes a controller for controlling the driver to variably apply the electric field to the actuator body; the controller controls the driver in response to the output produced by the sensor; the system further includes at least a second driver for applying a variable electric field to the actuator body; the controller also controls the second driver to variably apply an electric field to the actuator body; the system further includes a second controller for controlling the second driver to variably apply the electric field to the actuator body; the system further includes at least a second sensor for sensing a second phenomenon produced by the mechanical system in response to the piezoelectric movement of the actuator body, and the second sensor produces an output corresponding to the second phenomenon produced by the mechanical system; the driver applies the electric field in response to the second sensor output; at least one sensor is a displacement sensor and at least one sensor is not a displacement sensor; the first sensor is not a displacement sensor and the second sensor is a displacement sensor, and the second phenomenon is a displacement caused by the piezoelectric movement of the actuator body in response to the output of the first sensor; at least two sensors are displacement sensors; at least a second actuator device has an actuator body formed from a relaxor-based piezoelectric material and a mechanical system driven by the actuator body; the system further includes a first support structure and a second support structure, the actuator body is supported by the first support structure and the sensor is supported by the second support structure, and the first and second support structures are structurally independent of each other.

In other features of this aspect, the relaxor-based piezoelectric material is a relaxor ferroelectric material; the relaxor-based piezoelectric material is PMN, PZN, a solid solution of PMN and PT, or a solid solution of PZN and PT; the relaxor-based piezoelectric material is a solid solution of PZN and PT, wherein PT is 8%; the relaxor-based piezoelectric material is a solid solution of PZN and PT, wherein PT is 4.5%; the relaxor-based piezoelectric material is a solid solution of PMN and PT, wherein PT is 24%; the actuator body is rectilinear in shape; the actuator body is curvilinear in shape; and the actuator body is formed from at least two bi-morph elements.

In another aspect of the present invention, a method of controlling an electromechanical actuator system includes the steps of: applying an electric field to an actuator body formed from a relaxor-based material to generate a piezoelectric movement in the actuator body; in response to the piezoelectric movement of the actuator body, producing a phenomenon in a mechanical system; sensing the phenomenon produced by the mechanical system; and varying the applied electric field according to the outcome of the sensing step.

In features of this aspect, the method further includes the step of generating an output signal corresponding to the phenomenon produced by the mechanical system; the method further includes the step of comparing the output signal to a signal representing a desired state; the step of varying the applied electric field is carried out according to the outcome of the comparing step; the step of producing a phenomenon includes causing a first surface to move relative to a second surface, and the step of sensing includes measuring the separation between the first and second surfaces; the step of causing a first surface to move relative to a second surface includes causing the first surface to move in a first direction defining an axis, and the axis intersects the first and second surfaces; the magnitude of the piezoelectric movement of the actuator body is substantially equivalent to the magnitude of change caused by the piezoelectric movement in the separation between the first and second surfaces; the sensing step is carried out in a location generally adjacent to the actuator body; the step of producing a phenomenon in the mechanical system includes physically contacting a first moving member of the mechanical system with the actuator body, the area of physical contact between the first moving member and the actuator body generally defines a first location in the mechanical system, and the movement of the first surface relative to the second surface occurs in a second location in the mechanical system; the mechanical system includes a lever, and the step of causing movement of the first surface relative to the second surface includes transmitting movement from the actuator body via the lever; the step of producing a phenomenon includes producing a displacement; the step of producing a displacement includes producing a displacement of at least a portion of the mechanical system; the step of producing a displacement includes producing a linear displacement; the step of producing a displacement includes producing a rotational displacement; the step of sensing includes sensing the proximity of a surface to the tip of a proximity probe; the step of sensing includes measuring strain; and the step of sensing includes detecting a phenomenon other than displacement.

In yet another aspect of the present invention, an electromechanical actuator system includes: an actuator device having an actuator body formed from a relaxor-based piezoelectric material and a mechanical system driven by the actuator body; a driver for variably applying an electric field to the actuator body; and a feedback loop for providing input to the driver in response to at least one phenomenon produced by the mechanical system.

In features of this aspect, the phenomenon produced by the mechanical system is in response to piezoelectric movement of the actuator body, and the driver applies the electric field in response to the input from the feedback loop; piezoelectric movement of the actuator body causes a first surface to move relative to a second surface, and the feedback loop provides input to the driver regarding the separation between the first and second surfaces; the input provided regarding the separation between the first and second surfaces is based on a measurement of the separation between the first and second surfaces; the piezoelectric movement of the actuator body defines a direction of movement, and the direction of movement intersects the first and second surfaces; the mechanical system includes a first moving member in direct physical contact with the actuator body, the area of contact generally defines a first location in the mechanical system, and the movement of the first surface relative to the second surface occurs in a second location in the mechanical system; the mechanical system includes a lever, and the movement of the first surface relative to the second surface is transmitted from the actuator body via the lever; the phenomenon produced by the mechanical system is a displacement of at least a portion of the mechanical system; the feedback loop provides input to the driver regarding a phenomenon other than displacement; the system further includes a comparator for comparing input from the feedback loop to a signal representing a desired state; the system further includes a controller for controlling the driver to variably apply the electric field to the actuator body in response to the input from the feedback loop; the system further includes at least a second driver for applying a variable electric field to the actuator body; the feedback loop further provides input to the driver in response to at least a second phenomenon produced by the mechanical system, and the second phenomenon is produced in response to piezoelectric movement of the actuator body; and the system further includes at least a second actuator device having an actuator body formed from a relaxor-based piezoelectric material and a mechanical system driven by the actuator body.

BRIEF DESCRIPTION OF THE DRAWINGS

Further features, embodiments, and advantages of the present invention will become apparent from the following detailed description with reference to the drawings, wherein:

FIGS. 13A and 13B are cross-sectional schematic views of a second exemplary relaxor actuator motion control system using the generalized closed loop control system of FIG. 7;

DETAILED DESCRIPTION OF THE PREFERRED EMBODIMENTS

Figure 1:
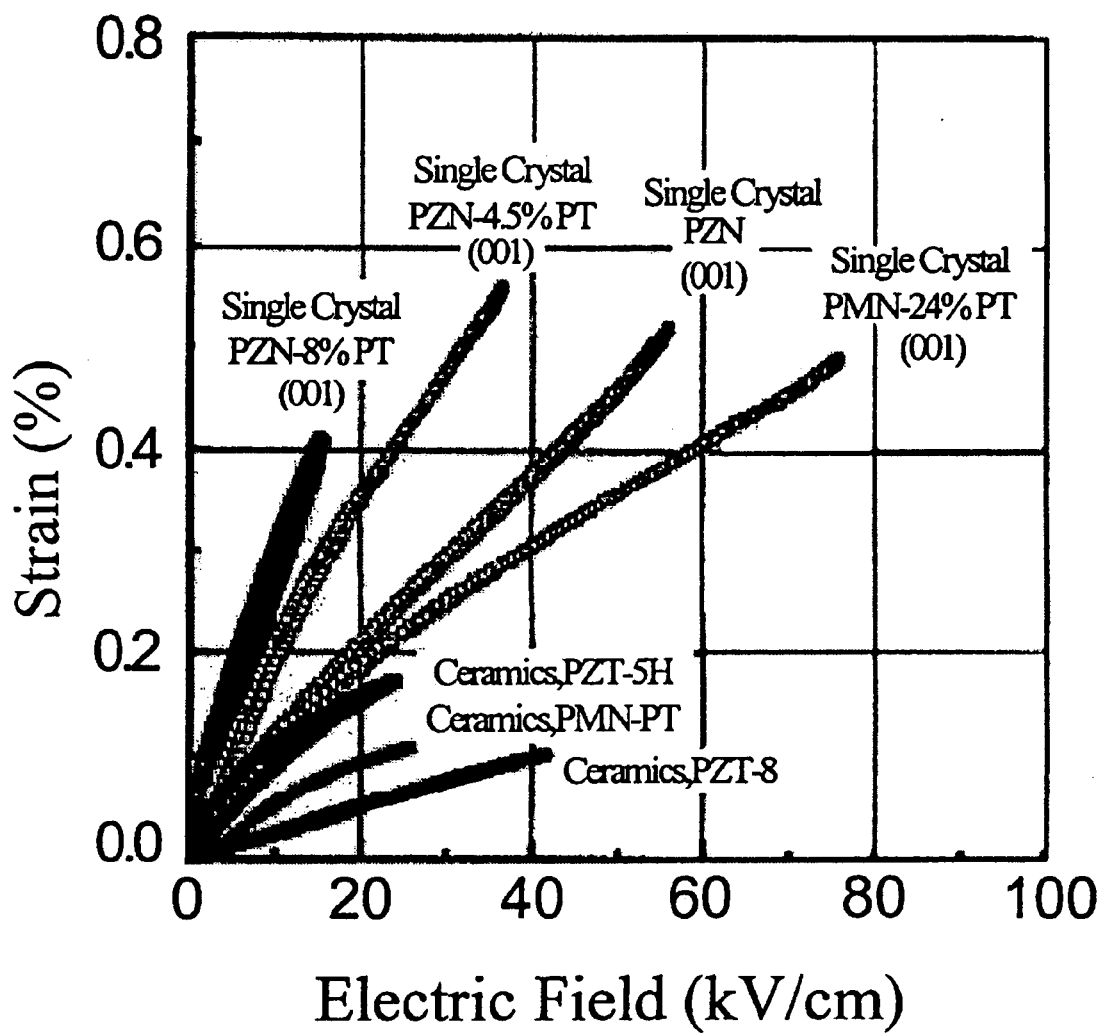
FIG. 1 is a graphical representation comparing the relationship between the strain and electric field behavior for various crystals of PZN-PT and PMN-PT to that of various electromechanical ceramics.
Figure 2:
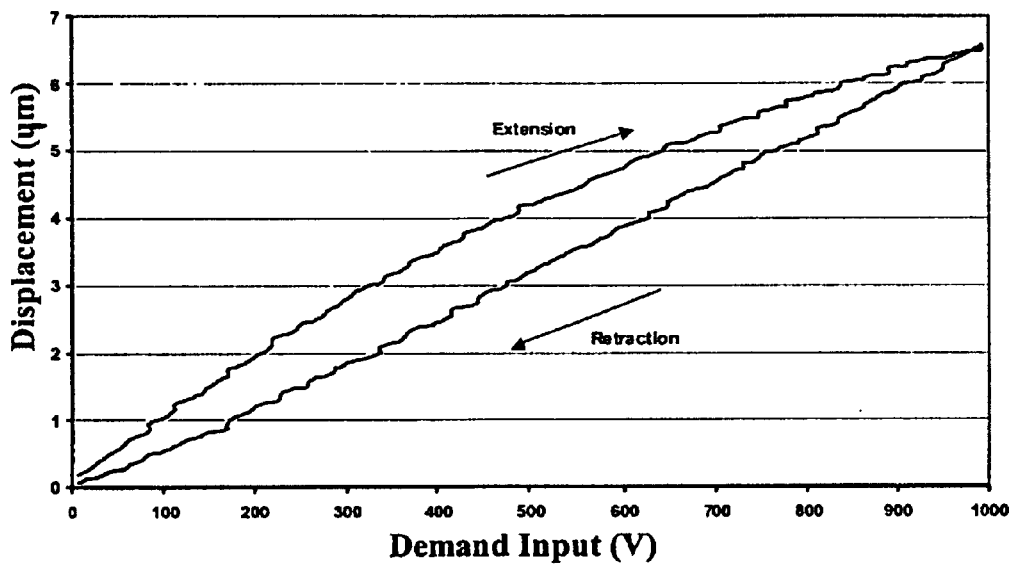
FIG. 2 is a graphical illustration of a typical hysteretic curve of morphotropic PZT material without the use of the closed loop control system of the present invention.
Figure 3:
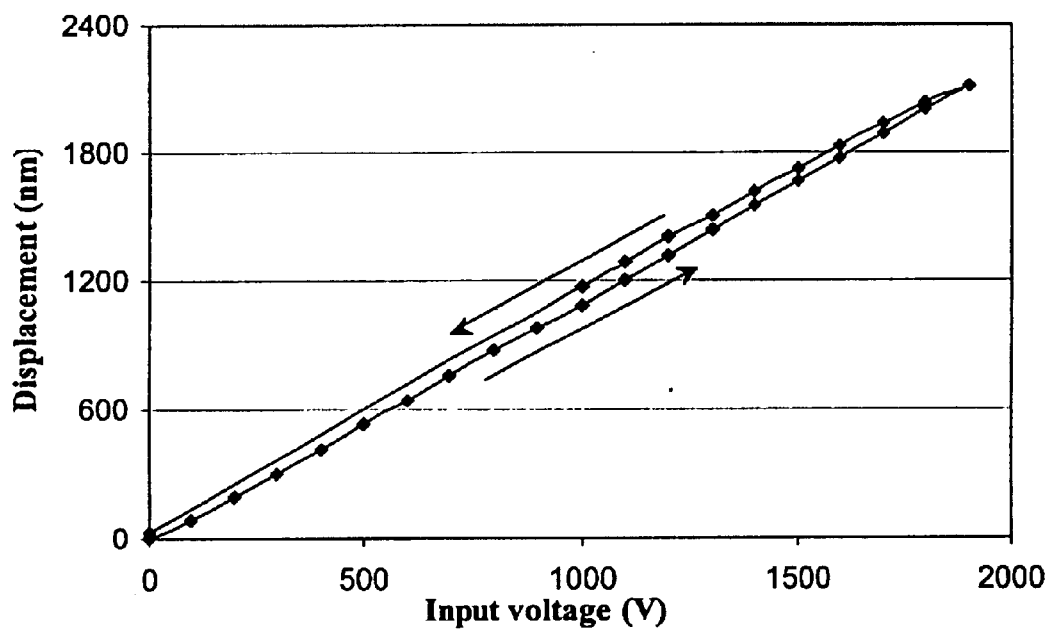
FIG. 3 is a graphical illustration of a typical hysteretic curve of morphotropic PZN material without the use of the closed loop control system of the present invention.
Figure 4:
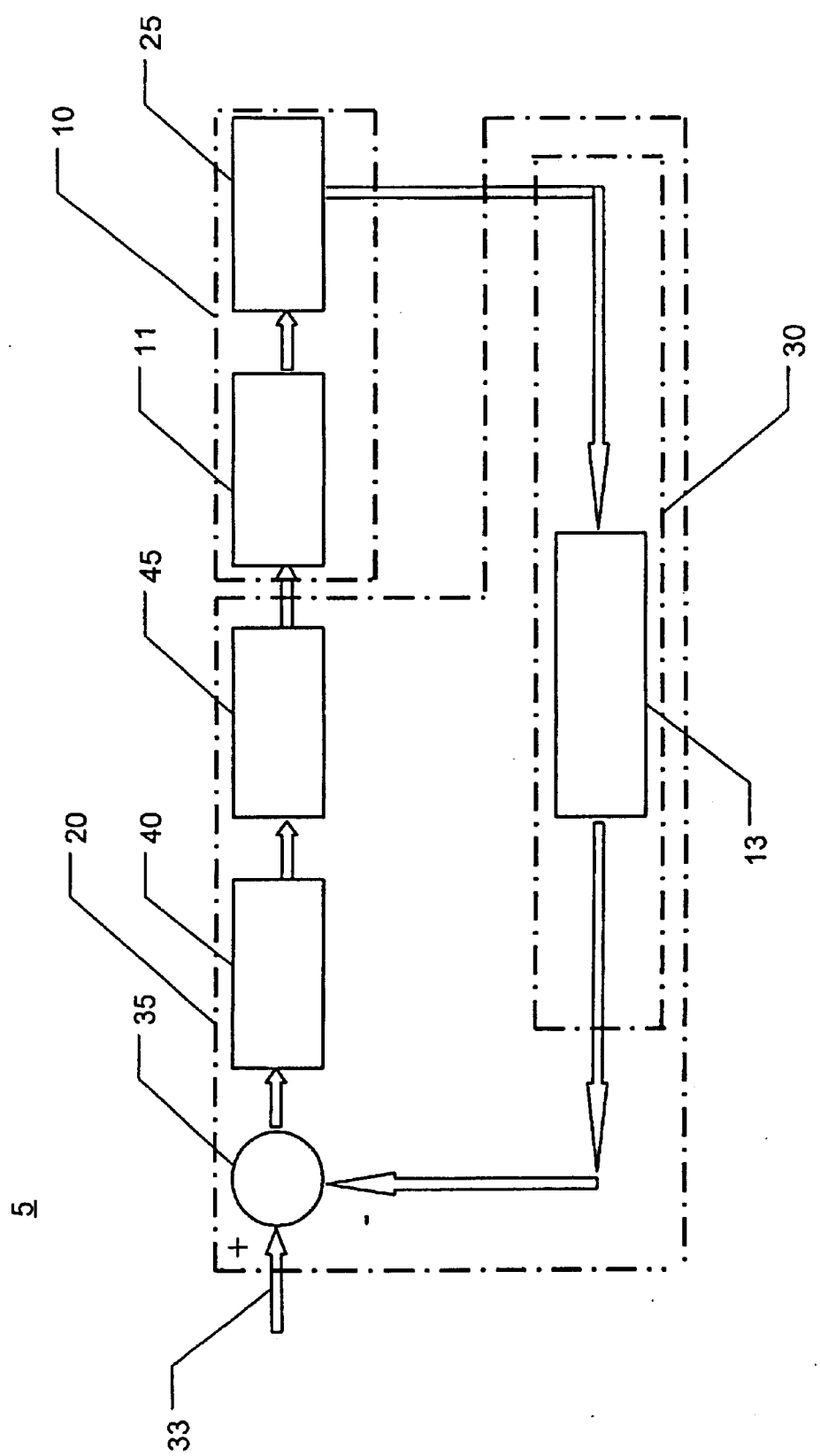
FIG. 4 is a block diagram of a generalized relaxor actuator-based closed loop control system in accordance with the preferred embodiments of the present invention.

FIG. 4 is a block diagram of a relaxor actuator-based closed loop control system 5 in accordance with the preferred embodiments of the present invention. The system 5 comprises one or more relaxor actuator devices 10 and one or more corresponding closed loop controllers 20 for controlling each actuator device 10. Each actuator device 10 includes a body of relaxor-based piezoelectric material 11 and a mechanical system 25.

In a preferred embodiment, the relaxor-based piezoelectric material 11 is a relaxor ferroelectric material such as Pb(Mg$_{1/3}$Nb$_{2/3}$)O$_3$ ("PMN"), Pb(Zn$_{1/3}$Nb$_{2/3}$)O$_3$ ("PZN"), or a solid solution of PMN or PZN with PbTiO$_3$ ("PT"). PT solutions known to be suitable include PZN-8% PT, PZN-4.5% PT and PMN-24% PT, although other solutions may be suitable as well. These materials evidence very high strain values if the crystalline form of their constituents is restricted to the rhombohedral structure and an electric field is applied thereacross so as to be in general alignment with the <001> crystallographic axis. Such ferroelectrics exhibit low levels of hysteresis and thus may be driven at relatively high frequencies without overheating. In addition, the compositions exhibit increased phase transition field values, allowing increased transducer driving voltages, decreased fabrication degradation and high electromechanical couplings of greater than 85% and up to a maximum of 94%.

The materials comprising the invention are preferably in solid solution form. The actuator body 11 may be either a single crystal actuator or a stack of these actuators, as described in U.S. Pat. No. 6,048,394 to Harmer et al. In practice, when using stacked actuators, it is often necessary to apply a preload to realize optimal performance. The electric field is typically applied as a voltage to electrodes (not shown) deposited on at least two surfaces of the actuator body 11.

Figure 5:
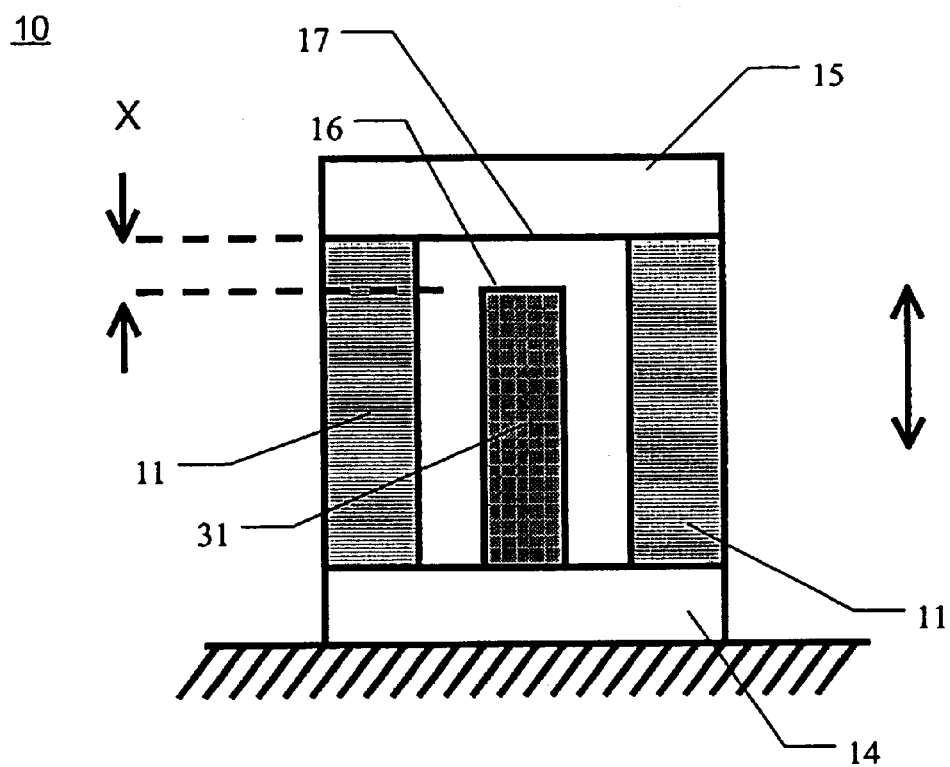
FIG. 5 is a cross-sectional schematic view of a first exemplary relaxor actuator device suitable for use with the preferred embodiments of the present invention.

A wide variety of relaxor actuators devices 10 are well known in the art. FIG. 5 is a cross-sectional schematic view of a first exemplary relaxor actuator device 10 suitable for use with the preferred embodiments of the present invention. This actuator device 10, commonly referred to as a "stack-type" or "cylindrical" actuator, provides motion control in the vertical "x" direction. As illustrated in FIG. 5, the actuator body 11 is in the form of a hollow cylinder, which may be formed unitarily or may be formed from a plurality of stacked rings or disks. The mechanical system 25 includes a base 14, which is fixed in place on a substrate or the like, and an end cap 15. The base 14 and end cap 15 are both formed from a generally rigid material that maintains its size and shape when passed through an electric field. One end of the actuator body 11 is attached to the base 14, and the end cap 15 is attached to the other end of the actuator body 11. When an electric field is applied to the actuator device 10, the actuator body expands or contracts according to the magnitude of the field, and the end cap 15 is correspondingly caused to move out or in. The end cap 15 is thus the mechanism by which the expansion and contraction of the actuator body 11 is transmitted.

In an alternative embodiment, the end cap 15 may be eliminated. However, in practice, the actuator device 10 is often fastened together using regular fastening means such as screws or clamps. Unfortunately, piezoelectric materials are both brittle and difficult to machine. Pushing directly against sharp contacts might cause the actuator body 11 to crack at high loads. In addition, threads formed in piezoelectric materials are not strong enough for many applications and would be prone to catastrophic failure. Hence, it is preferable, and more common, for end caps 15 and other structures formed from more suitable materials to be fastened to at least one end of the actuator body 11. Typically, these end caps 15 are maintained in contact with the actuator body 11 using glues, a spring mechanism, or a weight, or a combination thereof (not shown). For stack-type actuator bodies 11, in which case the actuator body 11 is made up of a stack of relaxor elements, the spring mechanism also provides a beneficial preload.

Figure 6:
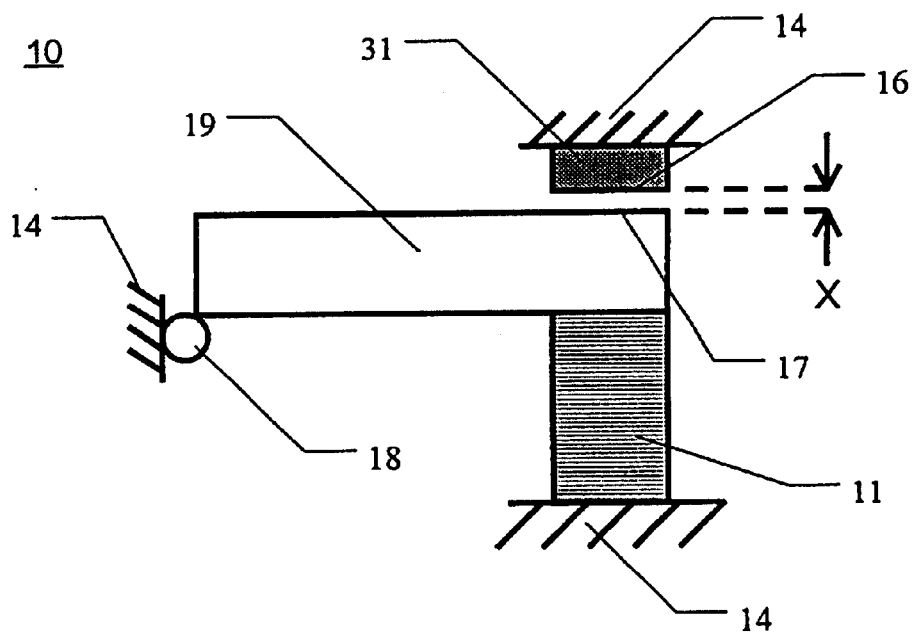
FIG. 6 is a cross-sectional schematic view of a second exemplary relaxor actuator device suitable for use with the preferred embodiments of the present invention.

FIG. 6 is a cross-sectional schematic view of a second exemplary relaxor actuator device 10 suitable for use with the preferred embodiments of the present invention. This actuator device 10, commonly referred to as a "rectangular" actuator, provides rotational or linear displacement in the "x" direction. The actuator body 11 is rectangular in shape and translates against a member with a single rotational degree of freedom. As with the stack-type actuator of FIG. 5, the mechanical system 25 includes a base 14, which is fixed in place, and a rotating arm 18, which is attached to the base 14 via a hinge 18. The base 14 and the rotating arm 19 are both formed from a generally rigid material that maintains its size and shape when passed through an electric field. One end of the actuator body 11 is attached to the base 14, and the rotating arm 19 is disposed at the other end of the actuator body 11. The rotating arm 19 is typically maintained in contact with the actuator body 11 using glues, a spring mechanism, or a weight, or a combination thereof (not shown). When an electric field is applied to the actuator device 10, the actuator body 11 expands or contracts according to the magnitude of the field, and the rotating arm 19 is correspondingly caused to rotate accordingly about the hinge 18. The rotating arm 19 is thus the mechanism by which the expansion and contraction of the actuator body 11 is transmitted.

The actuator bodies 11 shown in FIGS. 5 and 6 are meant to be illustrative of the various shapes that actuator bodies 11 may take and the type of displacement that may be generated. Actuator bodies 11 may take on a wide variety of shapes and configurations. An example of the use of flat actuator bodies 11 in actuator devices 160 is shown in FIGS. 13A and 13B. Actuator bodies 11 may have a variety as of rectilinear forms not illustrated herein as well as curvilinear shapes, such as conical and spherical sections, and many other forms and shapes. Also, it should be clear that any actuator body 11 may be used to generate either linear or rotational displacement through the use of the proper mechanical system 25.

Returning to FIG. 4, each closed loop controller 20 includes a feedback loop 30 for feeding back information about the current state of the actuator 10 in the mechanical system 25, a comparator 35 for combining current actuator state information with input information representing the desired state of the actuator 10, a motion controller 40 and one or more drivers 45. In the simple implementation of FIG. 4, the feedback loop 30 includes a single feedback sensor 13 that is connected or corresponds to an output of the mechanical system 25. The feedback sensor 13 transmits a feedback signal, based on some physical phenomenon of the mechanical system 25, to the comparator 35. Any physical phenomenon from which a measurable signal may be produced by the sensor 13 may be used for feedback. The type of feedback sensor 13 used is dependent on the physical phenomenon to be sensed.

Figure 7:
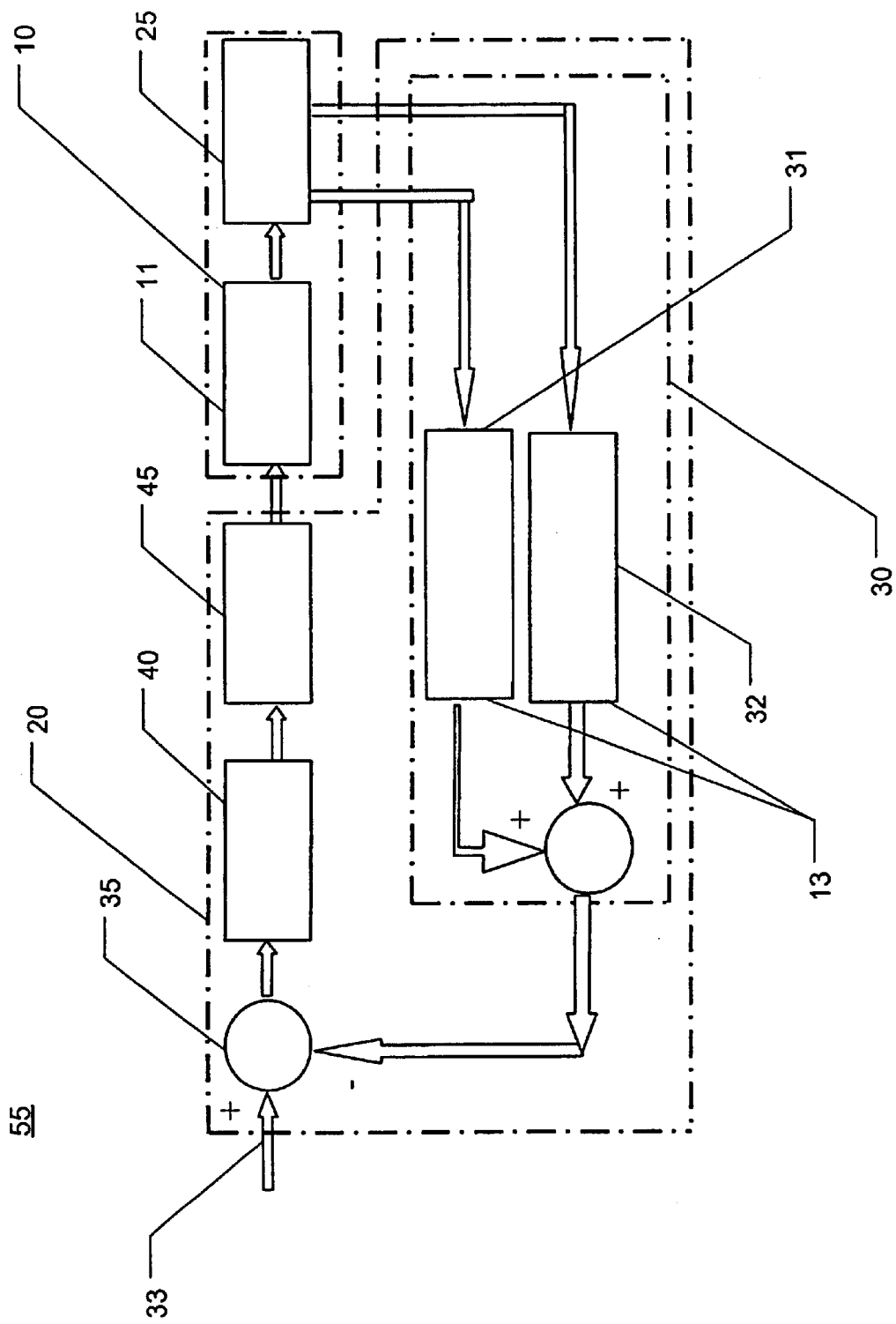
FIG. 7 is a block diagram of a generalized relaxor actuator-based closed loop control system using a plurality of feedback sensors in accordance with the preferred embodiments of the present invention.

In more complex implementations, the feedback loop 30 includes a plurality of feedback sensors 13, each of which detects and quantifies a particular physical phenomenon, and the respective output signals are combined using well known techniques to produce a feedback signal that may then be transmitted to the comparator 35. FIG. 7 is a block diagram of a generalized relaxor actuator-based closed loop control system 55 using a plurality of feedback sensors 13 in accordance with the preferred embodiments of the present invention. As with the closed loop control system 5 of FIG. 4, any physical phenomenon from which a measurable signal may be produced by the sensors 13 may be used for feedback. The type of feedback sensor 13 used in each case is dependent on the physical phenomenon to be sensed. Other than the number of feedback sensors 13 utilized, the closed loop control system 55 of FIG. 7 is similar to the system 5 of FIG. 4.

Feedback sensors 13 may be generally classified as either displacement sensors 31 or non-displacement sensors 32. As used herein, "displacement sensors" are those sensors 13 used to detect relative displacement between one surface of the mechanical system 25 and another, whereas "non-displacement sensors" are any other sensors 13 that may be used to generate a feedback signal to the comparator 35. Displacement sensors 31 are generally used to measure linear displacements, angular rotations and the like. Non-displacement sensors 32 may measure any other variable that is capable of being monitored, including, but not limited to, surface temperature, surface conductivity, surface proximity, or the interaction force between a force-measuring probe and a specimen surface. Both types of sensors 31, 32 may also be used for functions that do not involve closed loop feedback.

In the actuator devices 10 illustrated in both FIGS. 5 and 6, a displacement sensor 31 is mounted generally adjacent the actuator body 11. In the stack-type actuator of FIG. 5, the displacement sensor 31 is mounted on the base 14 generally adjacent to, and in coaxial disposition with, the actuator body 11. The sensor 31 is represented as a rod having a sensor surface 16 at its free end. The sensor 31 may be considered to act as a probe that measures the displacement between the free end sensor surface 16 and a proximate surface 17 on the end cap 15, which serves as the target for the displacement sensor 31. In the rectangular actuator of FIG. 6, a displacement sensor 31 is mounted on the base 14 generally adjacent to the actuator body 11 but on the opposite side of the rotating arm 19 from the actuator body 11. The sensor 31 is represented as a rectangular member having a sensor surface 16 at its free end. The sensor 31 is considered to act as a probe that measures the rotation between the free end sensor surface 16 and a proximate surface 17 on the rotating arm 19, which likewise serves as the target for the displacement sensor 31. It is important to note that although often desirable, it is not necessary that the two surfaces 16, 17 of the actuator 10 be either flat or parallel.

A wide variety of sensor types may be used as displacement sensors 31. Suitable sensor types include, but are not limited to, capacitance, inductance, eddy current, magnetic (Hall effect, giant magneto resistance ("GMR"), spin dependent tunneling ("SDT"), Anisotropic magneto resistance ("AMR"), superconducting quantum interference detection ("SQUID"), Josephson junction, and the like), tunneling, mechanical contact probe (i.e. a displacement transfer method such as stylus or AFM), optically-based sensors (diffraction, interferometric, refractive, spectrometric, linescales, encoders, Fabry-Perot intensity, and the like), and many others, the design, selection and operation of any of which are well known to those of ordinary skill in the art. Depending on the sensor type, the displacement that is measured may be the separation between a point on a first surface and a point on a second surface, the separation between the planes defined by two generally planar surfaces, or the like. Moreover, the output of the sensor may not be the separation itself, but a value determined as a function of separation. For example, many sensor types establish a "zero point," from which all measurements are made, that is not necessarily on either of the surfaces, but is maintained in a fixed relationship with one of the surfaces. In such a case, the measurement value provided as an output by the sensor would be the distance from one surface to the zero point and not the distance from one surface to the other surface. Finally, in some designs it might be possible to use a measurement of strain within the actuator body 11 or the mechanical system 25 to infer the displacement at a particular location in the mechanical system 25, rather than measure displacement directly.

The comparator 35 is used to compare the state of the system and the desired state. This comparison is represented by the circle with a plus and minus indicating a difference operator between the two inputs. The desired states of the system are represented as a desired set-point 33. The difference between these two states is often called the error and this is then fed to the controller 40. The objective of the controller 40 is to use the error values to derive appropriate values for the drivers 45 in an effort to reduce subsequent error values. A single controller 40 may be utilized to control the operation of anywhere from a single actuator device 10 to an entire array of actuator devices 10, with both coordinated and independent control of the devices 10 in the array being possible. Similarly, although only one feedback loop 30 and comparator 35 are illustrated in FIGS. 4 and 7, it should be clear that a single controller could receive and take into consideration the outputs from a plurality of comparators, each representing a corresponding error signal. Common controller means and strategies are well known to those of ordinary skill in the art. In the case of the present system 5, the drivers 45 may be electrical drivers to provide the applied voltage to the actuators 11. Changes in signal from the drivers 45 will result in changes in the field applied to the actuator bodies 11. Motion of the actuator bodies 11 will then be transmitted to the mechanical system 25 via mechanical contact. Within the mechanical system 25, motion may be monitored by any appropriate displacement or non-displacement sensors 13.

Figure 8:
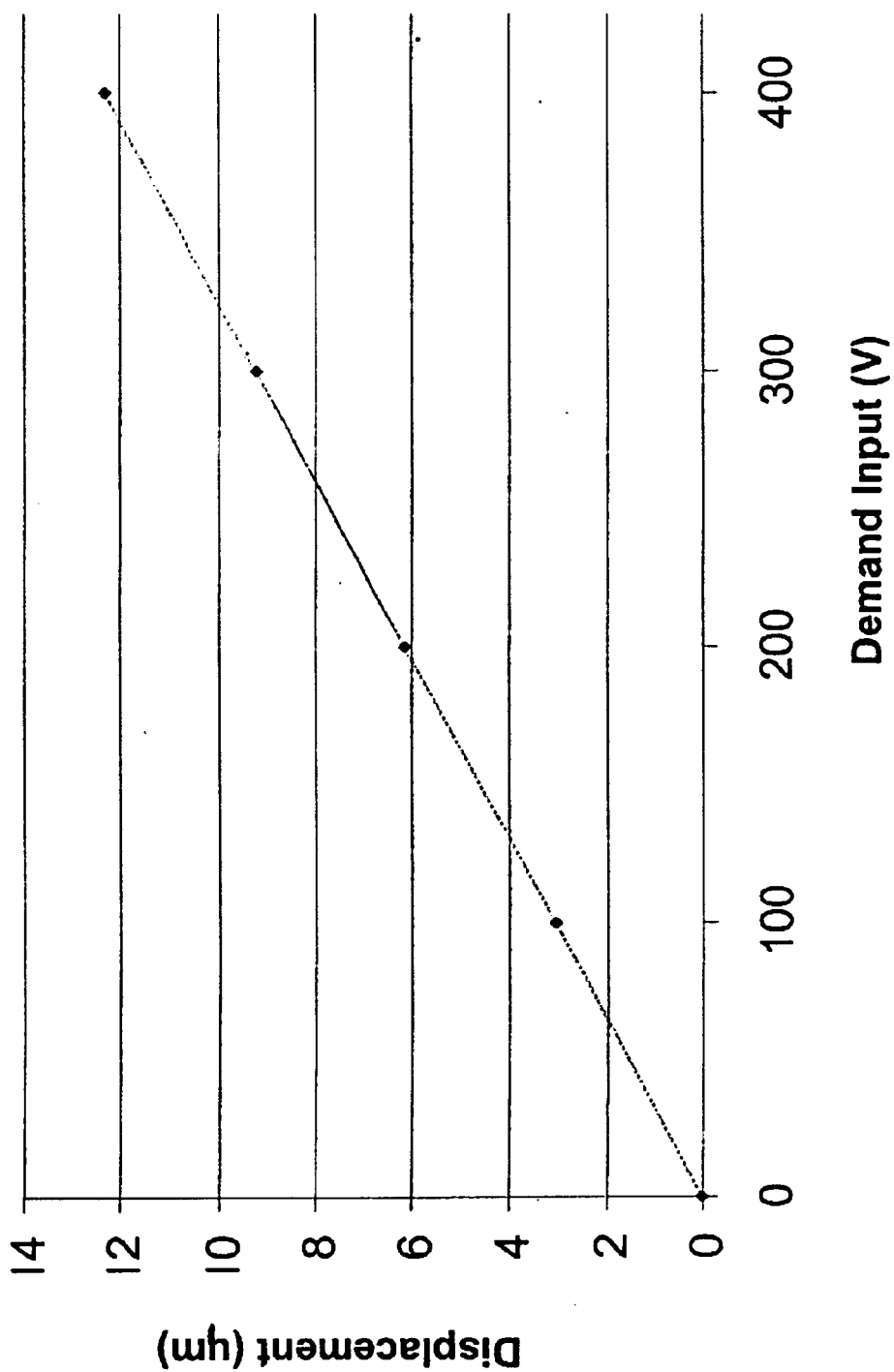
FIG. 8 is a graphical illustration of the experimental response of a piezoelectric actuator system utilizing the closed loop control system of FIG. 4 for applied set-point voltage (desired displacement) versus measured displacement.

FIG. 8 is a graphical illustration of the experimental response of a piezoelectric actuator system utilizing the closed loop control system 5 of FIG. 4 for applied set-point voltage (desired displacement) versus measured displacement. The actuator device 10 used was of the type shown in FIG. 5. In the graph, the desired set-point 33 is labeled the demand input. This demand input was generated by a computer program and converted to a voltage that was then used as the desired set-point 33 for the controller 40. Correspondingly, within the actuator device 10 itself was a capacitance-based displacement sensor 31 that provided an output voltage that was linearly proportional to the displacement between the two surfaces 16, 17 illustrated in FIG. 5. In this case, the controller 40 provided an output signal to the driver 45 that was a combination of the error signal, its time derivative and its time integral (such a controller often being referred to as a Proportional-Integral-Derivative, or PID, controller). The objective of the controller 40 was to maintain a null error as derived from the difference between the capacitance sensor voltage and that from the computer. Because the capacitance sensor 31 is linear, the subsequent displacement measured by the sensor 31 should be linearly related to the desired set-point 33 and should be independent of hysteresis in the piezoelectric actuator, creep and other characteristics. FIG. 8 shows the resultant displacement as measured by the displacement sensor 31 when a demand input has been ramped up to a value of 400 in four equi-number intervals and then ramped back down. For a perfect system, this should produce two straight lines, one as the displacement moves out and the other as the displacement moves back in. At the levels that can be discerned from this graph, as indicated by the overlapping lines in this figure, the hysteresis has been removed by the controller 40. Thus, as illustrated in FIG. 8, the application of closed loop control may be expected to result in the virtual elimination of hysteresis in the response of the relaxor actuator devices 10 to a significant range of applied voltages.

Returning to FIGS. 5 and 6, it may be seen that in each of the actuator devices 10, the displacement sensor 31 is disposed generally adjacent the actuator body 11. In addition, both the sensor surface 16 and the proximate surface 17 of each device 10 lie in the path of piezoelectric movement (expansion or contraction) of the respective actuator body 11. In other words, the sensor surface 16 and proximate surface 17 in each actuator device 10 are intersected by the central axis of each actuator body 11 as defined by its piezoelectric movement. However, it is an important aspect of this invention that displacement sensors 31 do not necessarily have to be disposed on or immediately adjacent the actuator body 11 itself, nor must the displacement being measured be linearly aligned with the direction of expansion or contraction of the actuator body 11. Instead, a displacement sensor 31 may be placed arbitrarily within the mechanical system 25 and is only required to measure linear or angular translation of a component or components of the mechanical system 25. The displacement sensor 31 may thus be at a separate location in the actuator device 10 from the actuator body 11.

For example, it is common in practice for a lever mechanism to be incorporated within an actuator device 10 in order to amplify or attenuate the actuator translation. The goal of such a mechanism is to produce an actuator device 10 containing a platform that will achieve the desired linear or angular translation. In such devices, it is common to measure the platform motion while translating from the other end of the lever. Many examples of this exist and represent normal practice to those skilled in the art of mechanism and flexure mechanism design. Suitable mechanisms for transmission of the displacement include levers, attenuating mechanisms and the like. Examples include simple and compound levers as well as lever mechanisms based on the so-called bi-morph effect. Approaches to the design of such mechanisms are well known to those of ordinary skill in the art.

Figure 9:
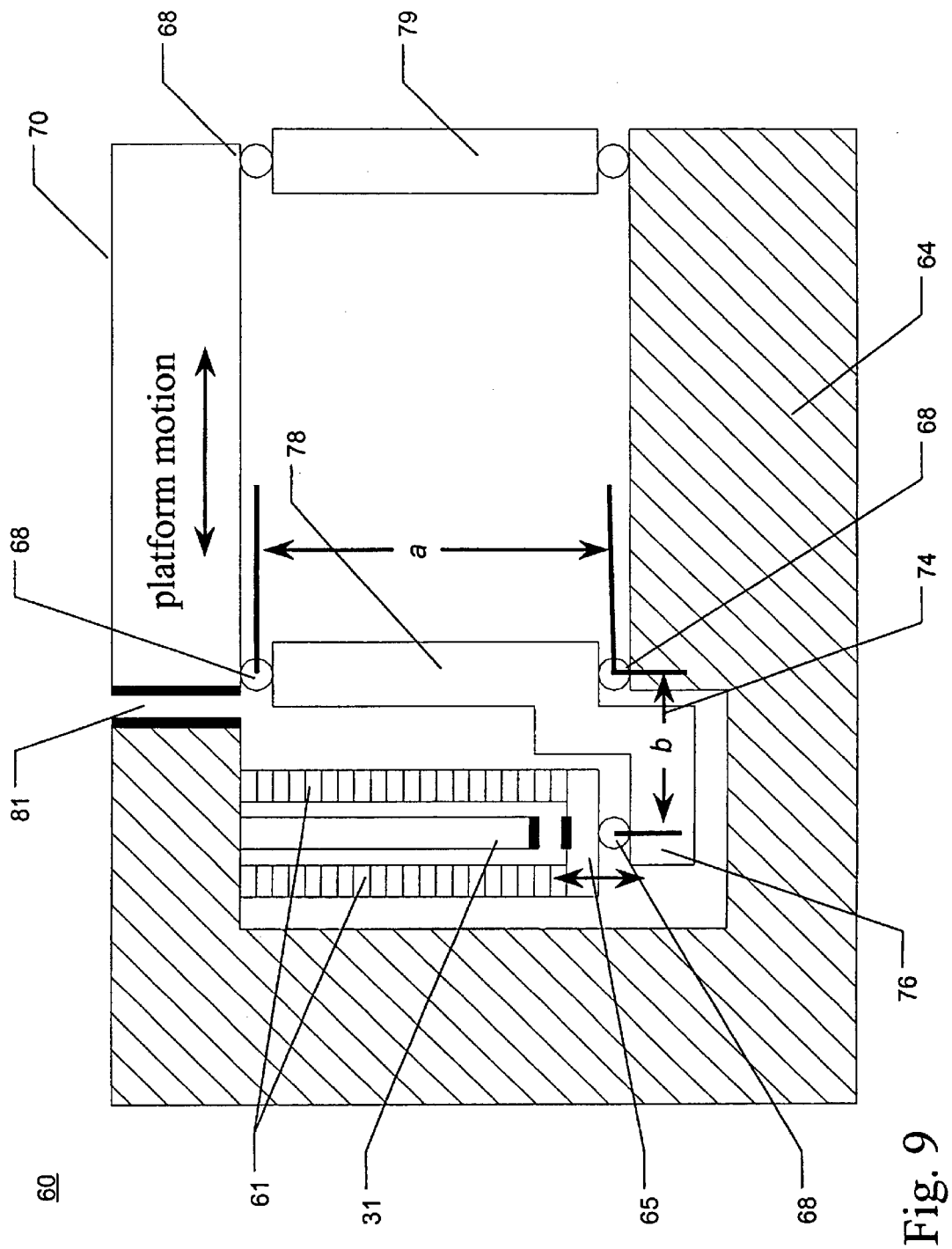
FIG. 9 is a cross-sectional schematic view of a third exemplary relaxor actuator device that utilizes a lever mechanism to move a platform.

FIG. 9 is a cross-sectional schematic view of a third exemplary relaxor actuator device 60 that utilizes a lever mechanism to move a platform 70. As illustrated, the actuator device 60 includes a stack-type actuator body 61 and a mechanical system 65 for transmitting motion from the actuator to a lever. The mechanical system 65 includes a fixed base 64 to which one end of the actuator body 61 is attached, an end cap 65 attached to the other end of the actuator body 61, a lever 74 for amplifying the motion of the actuator body 61, and a plurality of rotational hinges 68. General approaches to the design of lever mechanisms for amplification and attenuation are well known to those of ordinary skill in the art. In this particular example, the lever 74 includes a lever arm 76 and a support leg 78. One end of the moving platform 70 is attached to the support leg 78 of the lever 74 via a hinge 68, and the other end of the moving platform 70 is attached to a second support leg 79 via another hinge 68. The opposite ends of the support legs 78, 79, which are of generally equal lengths, are attached to the base 64 by additional hinges 68. The lever arm 76 is connected to the end cap 65 via one hinge 68 and to the base 64 via the hinge 68 at the bottom of the first support leg 78. Hinges 68 suitable for use in the preferred embodiments of the present invention are well known and include, but are not limited to, hinges constructed from sliding surfaces, rolling elements or compliant flexures.

When an electric field is applied to the actuator device 60, the relative expansion between the two ends of the actuator body 61 results in a vertical motion of the free end of the stack as shown. This motion is transmitted to the first (left-hand) support leg 78 via the first hinge 68. Motion of the support leg at the first hinge 68 causes it to rotate about the hinge 68 that is attached to the base 64. This angular rotation is transmitted to the platform 70 resulting in the movement of the platform 70 from side to side. Because the two support legs 78, 79 are parallel and of the same dimensions, the moving platform 70 will always remain horizontal during a translation. Additionally, for small rotations of the support legs 78, 79, the movement of the platform 70 is approximately linear.

One displacement sensor 31 is shown disposed within the core of the actuator body 61, with a target surface 17 disposed on the end cap 65. As with the actuator 10 of FIG. 4, However, because there is a fixed relationship between the displacement of the actuator body 61 and displacement of all moving elements in the mechanical system 65, motion can be measured at almost any location in the mechanical system 65. For example, a displacement sensor 81 could be disposed on an end of platform 70 or on the portion of the base 64 adjacent thereto. In FIG. 9, the displacement sensors 31, 81 and their target surfaces are indicated by thick parallel lines located on adjacent surfaces of two components of the actuator device 60. It is assumed that the sensors 31, 81 measure displacement of the components in a direction that would bring the two surfaces either closer together or further apart. During motion, these parallel lines would remain approximately parallel.

Measurement of displacement for the purpose of feedback control is indicated both at a first location, in-line with the central axis of the actuator stack 61, and at a second location, in-line with the motion of the platform 70 relative to the base 64. If displacement of the platform 70 is to be utilized for feedback control, then the lever ratio of the lever 74 must be taken into consideration. If a is the distance between the hinge 68 attaching the lever 74 to the base and the hinge 68 at the other end of the first support leg 78 and b is the distance between the hinge 68 attaching the lever 74 to the base and the hinge 68 at the end cap 65, then the lever ratio for this lever 64 is given by the ratio b/a.

Multiple actuator devices may be combined in many ways to form more complex motion control systems. For example, closed loop control using relaxor actuators 10 may be incorporated into applications requiring control in more than one direction, such as mechanisms that enable control in two or more coordinate directions. Such mechanisms may include scanning stages that enable the scanning of a platform in a plane (typified by scanned probe imaging devices) or 'tip-tilt' stages for angular alignments with one or more linear translations (typified by optical element alignment and focusing devices).

Figure 10:
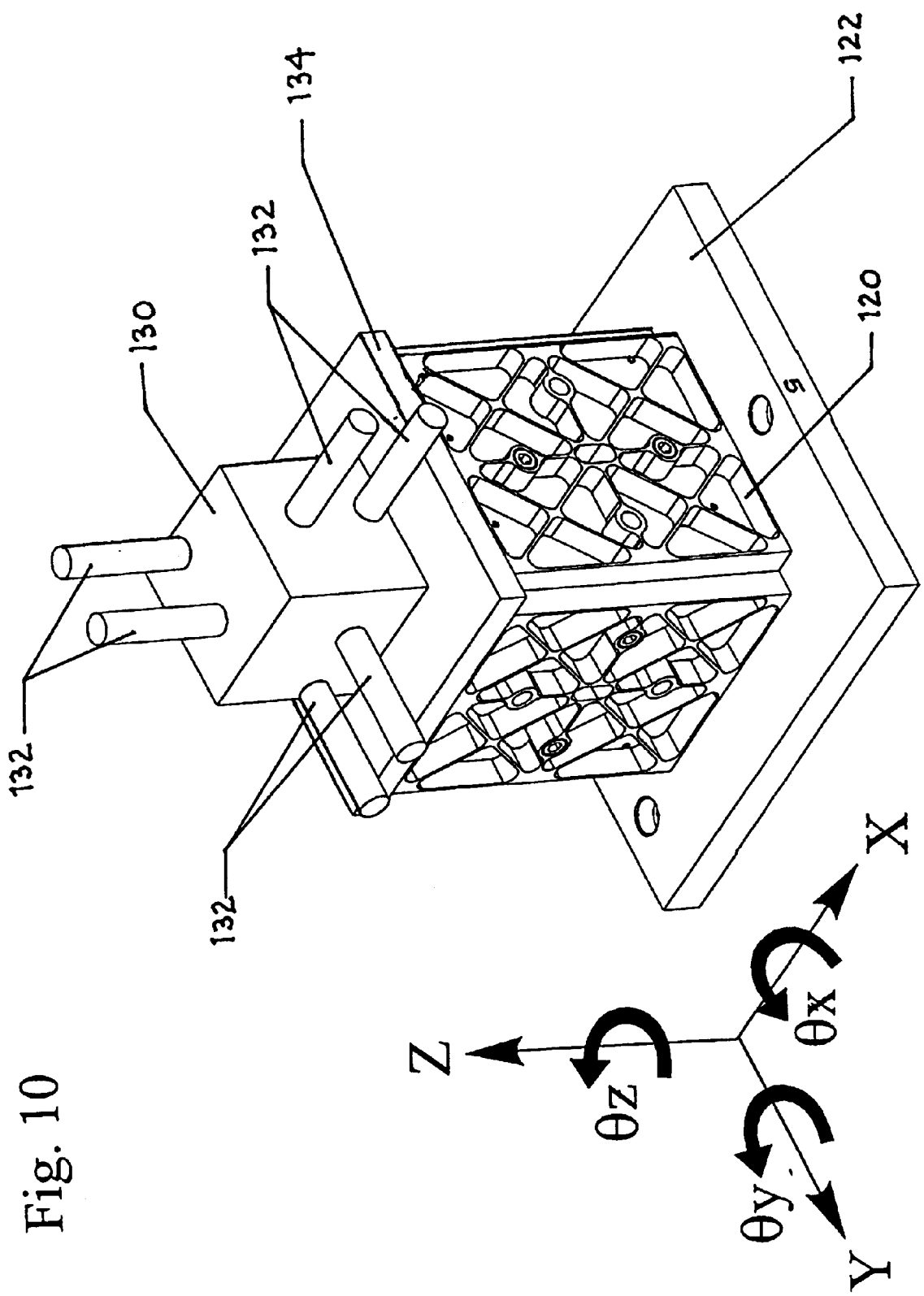
FIG. 10 is an orthogonal view of a first exemplary relaxor actuator motion control system using the generalized closed loop control system of FIG. 7.
Figure 11:
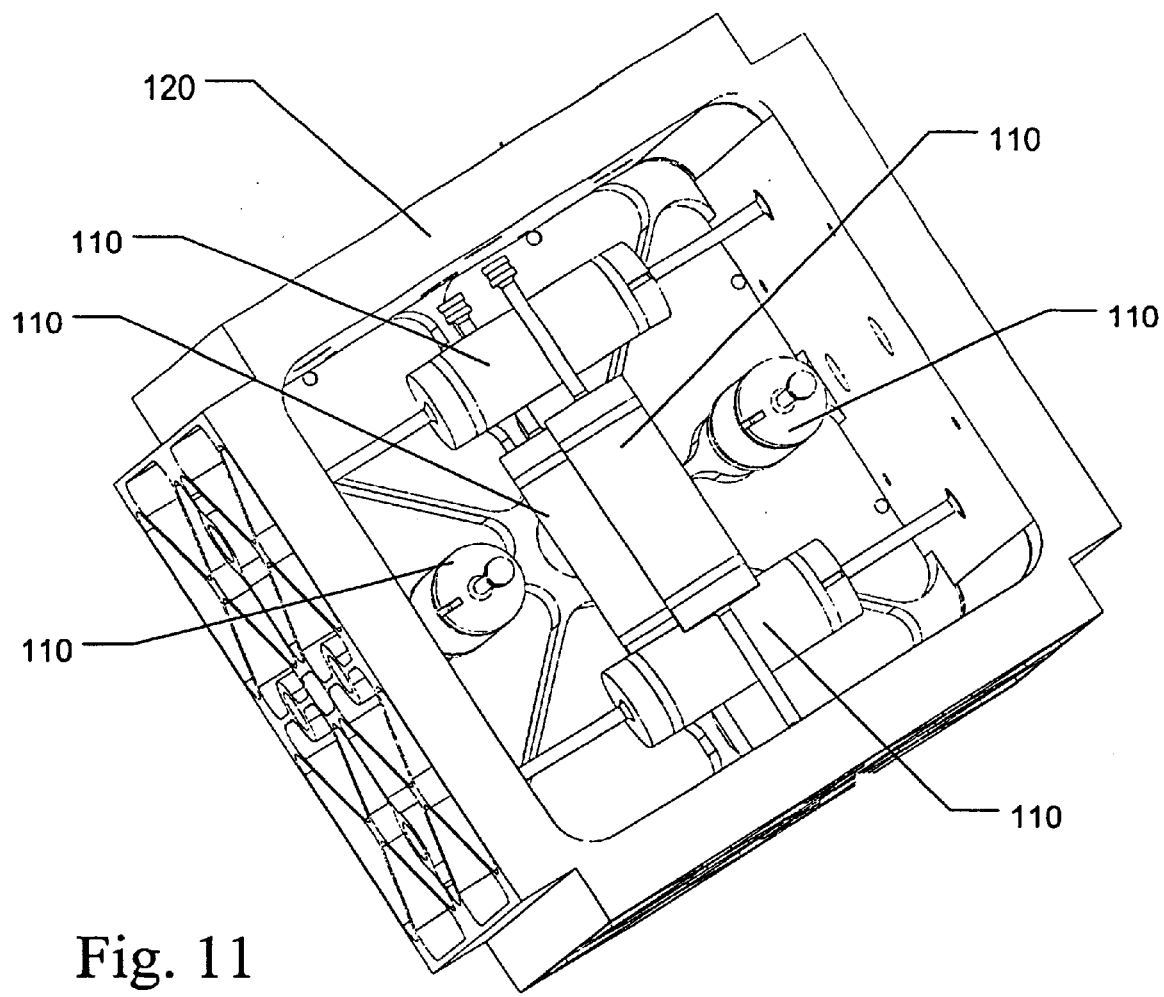
FIG. 11 is a perspective view from the underside of the platform of FIG. 10 with the base assembly removed, illustrating the relative disposition of the actuator devices therein.
Figure 12:
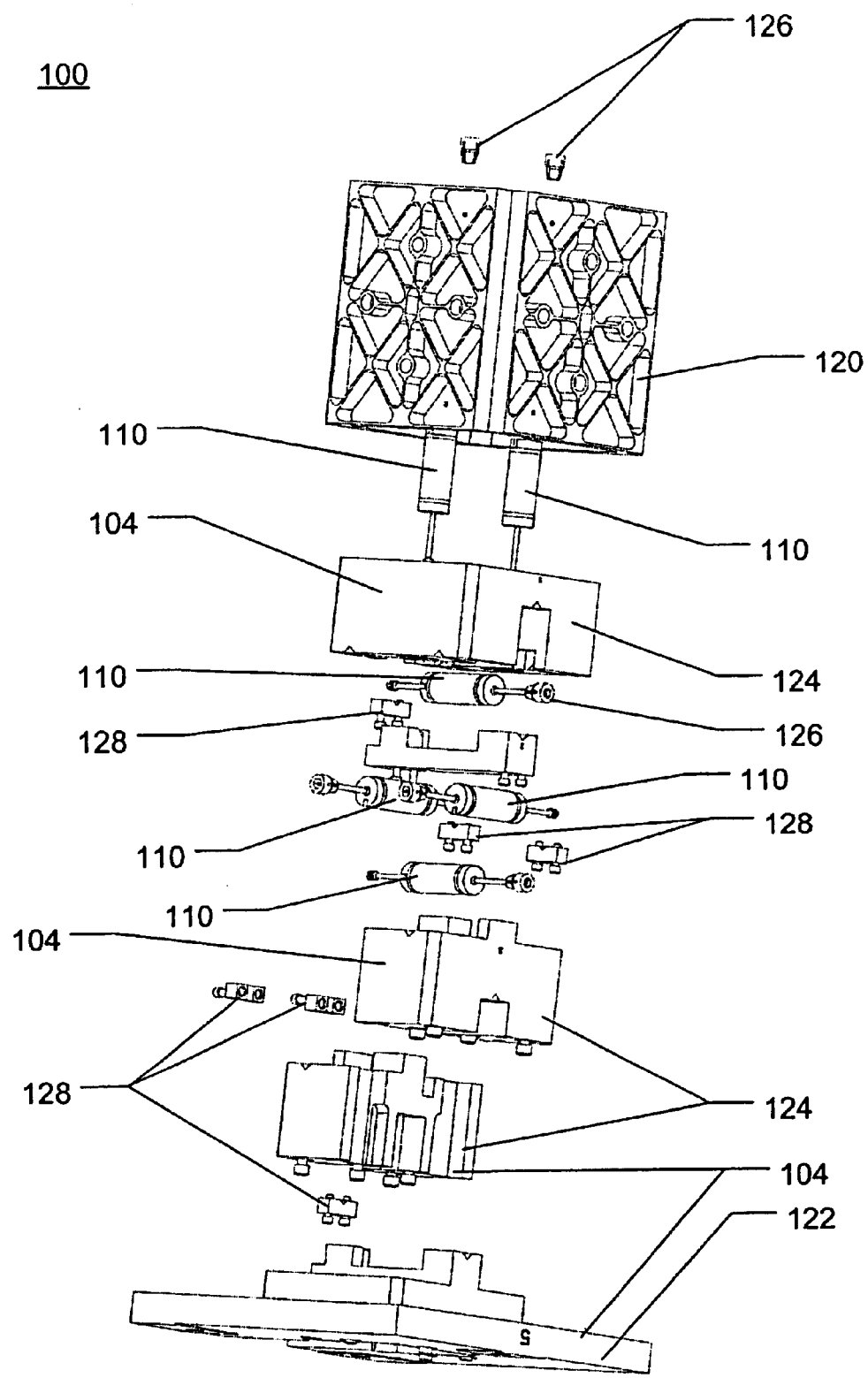
FIG. 12 is an exploded orthogonal view of the assembly of the platform, the base and the actuator devices of the system of FIG. 10.

FIG. 10 is an orthogonal view of a first exemplary relaxor actuator motion control system 100 using the generalized closed loop control system 5 of FIG. 7. The motion control system 100 includes a unitary moving platform 120 attached to a rigid base assembly 104 via three pairs of relaxor actuator devices 110 of a type similar to that illustrated in FIG. 5. As best seen in FIG. 11, the platform 120 is generally in the form of a rectangular box with one side removed. The platform 120 may be a monolithic structure machined from a solid block and pocketed so that the overall mass of the platform 120 is reduced while maintaining a high stiffness. FIG. 12 is an exploded orthogonal view of the assembly of the platform 120, the base assembly 104 and the actuator devices 110 of the system 100 of FIG. 10. As illustrated, the base assembly 104 includes a base mount 122 and a plurality of base members 124, which together form a rigid foundation for the system 100. During assembly, the base members 124 stack together on the base mount 122 with each piece interlocking in succession resulting in a nearly solid structure.

The actuator devices 110 are positioned orthogonally such that there are two actuator devices 110 for each plane of motion. FIG. 11 is a perspective view from the underside of the platform 120 of FIG. 10 with the base assembly 104 removed, illustrating the relative disposition of the actuator devices 110 therein. One actuator device 110 in each pair creates linear movement, while the other actuator device 110 in the pair creates angular rotation. Thus, this system 100 is capable of moving the platform 120 in six independent directions: three linear translations, each at right angles to the others, and three rotations, each with axes aligned with the three linear translations. As illustrated in FIG. 12, each of the actuator devices 110 is fastened at one end to the platform 120 by a small collet 126 and at the other end to the base assembly 104 by a squeeze clamp 128.

Feedback for the stage system is realized via three pairs of sensors 132 monitoring a cube 130 rigidly mounted to the top of the platform 120. A support surface 134 may be interposed between the cube 130 and the platform 120 to provide better support. The cube 130 is preferably made of a rigid, lightweight material such as aluminum. The sensors 132 are supported by a housing or other support structure (not shown) attached to the base assembly 104, which thus forms a rigid foundation from which relative displacements may be measured. Notably, although the sensors 132 are disposed in parallel with the axes of the actuator devices 110, they are not coaxial with, or disposed immediately adjacent to, the actuator devices 110. On type of sensor suitable for use with the preferred embodiments of the present invention is the capacitance gage sensor, but other suitable sensor types, many of which were listed previously, will be apparent to one of ordinary skill in the art.

In this work an orthogonal 2-2-2 configuration was chosen primarily to enable each of the three actuator pairs to control an individual rotation and translation with minimal coupling in other coordinate directions. The 2-2-2 configuration simplifies a number of design issues. The motion of the platform 120 is nominally decoupled, meaning that the motion in any one degree-of-freedom does not influence the others. This type of orientation enables optimization of motion in a plane. For example, a system requiring high resolution in one plane while a greater range in another could easily be accommodated by changing the actuator range or drive precision in that plane.

FIGS. 13A and 13B are cross-sectional schematic views of a second exemplary relaxor actuator motion control system 140 using the generalized closed loop control system 55 of FIG. 7. As described previously, relaxor actuator motion control systems 55 may make use of displacement sensors 31, non-displacement sensors 32, or both, sometimes operating simultaneously. Furthermore, the number of feedback sensors 13 does not have to be the same as the number of actuator devices. Both of these principles are illustrated in the system 140 of FIGS. 13A and 13B, which uses multiple actuator devices 160 to control the shape of an adaptive mirror 150. As illustrated in FIG. 13A, the mirror 150 is represented as a horizontal beam 152 simply supported at each end by flexible support elements 154 mounted on a base 144. An array of relaxor actuator devices 160 bonded to the underside of the mirror 150. Upon application of one or more applied electric fields, each actuator will undergo strain in both the direction of the electrodes and in directions perpendicular. The respective strains in the actuator array will produce corresponding stresses in the underside of the beam 152 that will subsequently change the shape of the beam 152, as illustrated in FIG. 13B. One or more non-displacement feedback sensors 32 may be disposed above the upper face of the mirror 150 for measuring the curvature of the beam 152. The optical focus of the mirror 150 will be related to the curvature and this might constitute a desired control parameter. In this case, the multiple actuator devices 160 might be used to control the displacements directly or a ratiometric measure of the three non-displacement sensors 32 may better suit the desired function of the system 140. This method for producing displacements is often referred to as a bimorph actuator. Another typical embodiment is to bond together two relaxor actuators in the form of thin plates and apply voltages of opposite polarity to each, thereby inducing equal and opposite strains. Because they are bonded together, they will tend to bend as a pair. Numerous examples exist in the literature.

Figure 14:
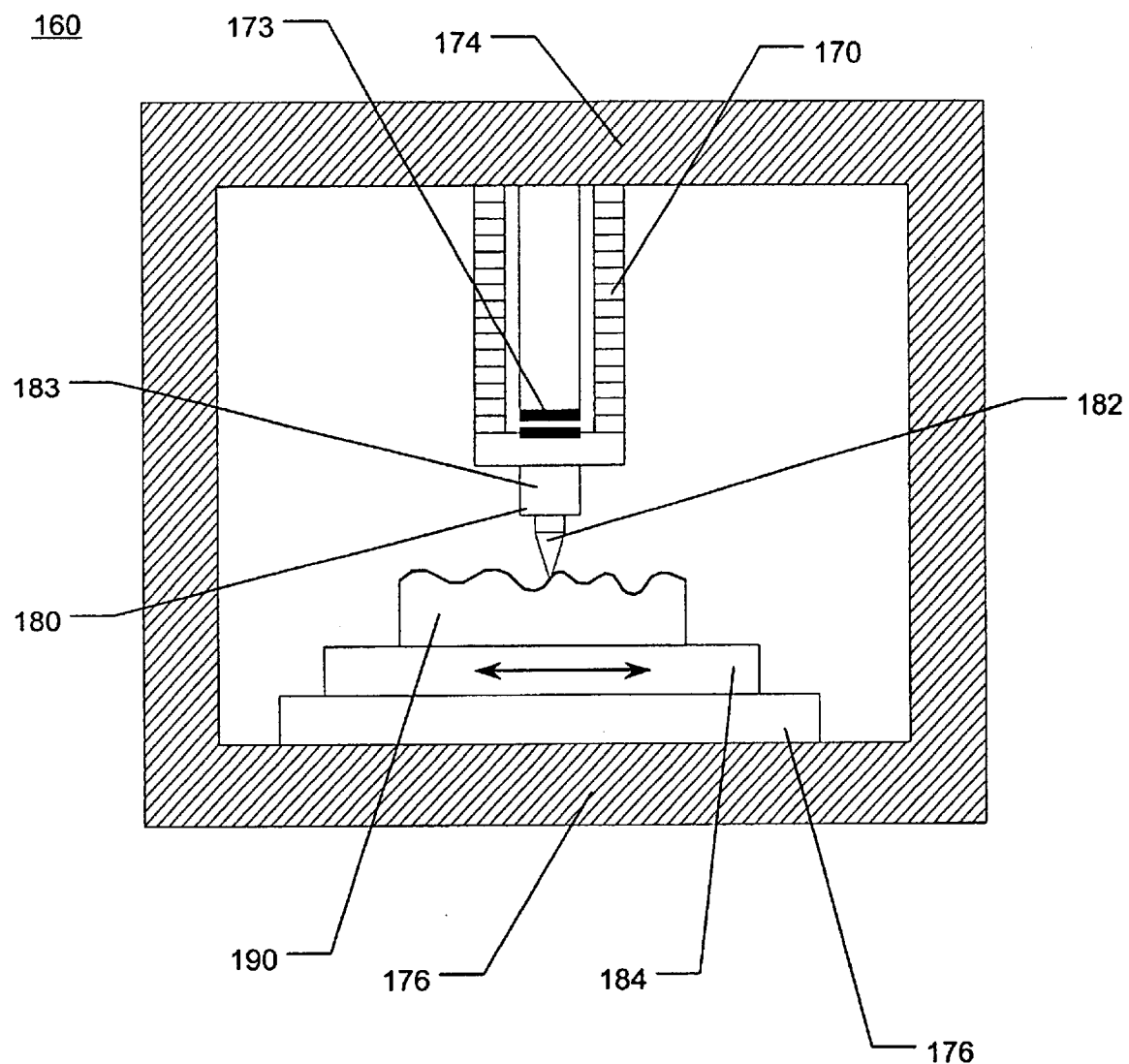
FIG. 14 is a cross-sectional schematic view of a third exemplary relaxor actuator motion control system using the generalized closed loop control system of FIG. 4.

One or more additional sensors 13 may also be added to or combined with a closed loop control system 5 to provide additional functionality. FIG. 14 is a cross-sectional schematic view of a third exemplary relaxor actuator motion control system 160 using the generalized closed loop control system 5 of FIG. 4. This system 160 may be utilized for precise profile measurement of a surface scan of a specimen of interest 190. The system 160 includes an actuator device 170 of a type similar to that illustrated in FIG. 5, a proximity probe 180 mounted on the actuator device 170, a translation support 176 on which the specimen 190 may be placed, and an instrument frame 174 for supporting the other components. The proximity probe 180 includes a probe tip 182 disposed directly above the surface of the specimen 190 and a feedback sensor 183 for providing information about the distance between the surface of the specimen 190 and the probe tip 182. Probes suitable for such a purpose include, but are not limited to, atomic force probes, photon probes, capacitive coupling probes, tapping probes, tunneling probes, electrostatic force probes, frictional force probes, magnetic force probes, and variations thereof.

If the specimen 190 is translated relative to the probe 180, the feedback sensor 183 of the probe 180 repeatedly or continuously provides a signal that is proportional to the closeness of intensity of an interaction between the probe tip 182 and the surface of the specimen 190 at any given moment. The feedback signal may then be used to generate an error signal that is used by the controller 40 to control the electric field applied to the actuator device 170. Based on the applied field, the actuator device 170 expands or contracts accordingly in order to maintain the distance between the probe tip 182 and the surface of the specimen 190 substantially constant. A displacement sensor 173 may then be used to monitor the displacement created by the actuator device 170. Because the displacement of the actuator device 170 reflects the amount of probe translation required to maintain the probe tip 182 at a constant distance above the specimen surface, the output from the displacement sensor 173 may thus be used by the system 160 to generate a surface or topographical scan of the specimen 190.

The accuracy of this scan will be enhanced if the translation of the specimen 190 relative to the probe 180, which may be achieved by moving the specimen 190 while the probe 180 remains stationary or vice versa, is substantially smooth, constant, linear and perpendicular to the axis of the actuator device 170. Such translations may be readily achieved using relaxor based actuators integrated within flexure mechanisms. Again, closed loop control of the scanning systems would be necessary. If used, the output from the scanning system indicating the motion of the specimen would be obtained from displacement sensors in the scanning stage. For example, it may be desired to scan the specimen in a plane under the probe tip 182. In this case, the position of the specimen 190 would be indicated by two displacement sensors (not shown) providing information about the latitudinal and longitudinal motion of the specimen 190. The first displacement sensor 173 would then provide relative height information about the specimen surface. This information can be combined to produce a three dimensional, or topographic, map of the surface.

Figure 15:
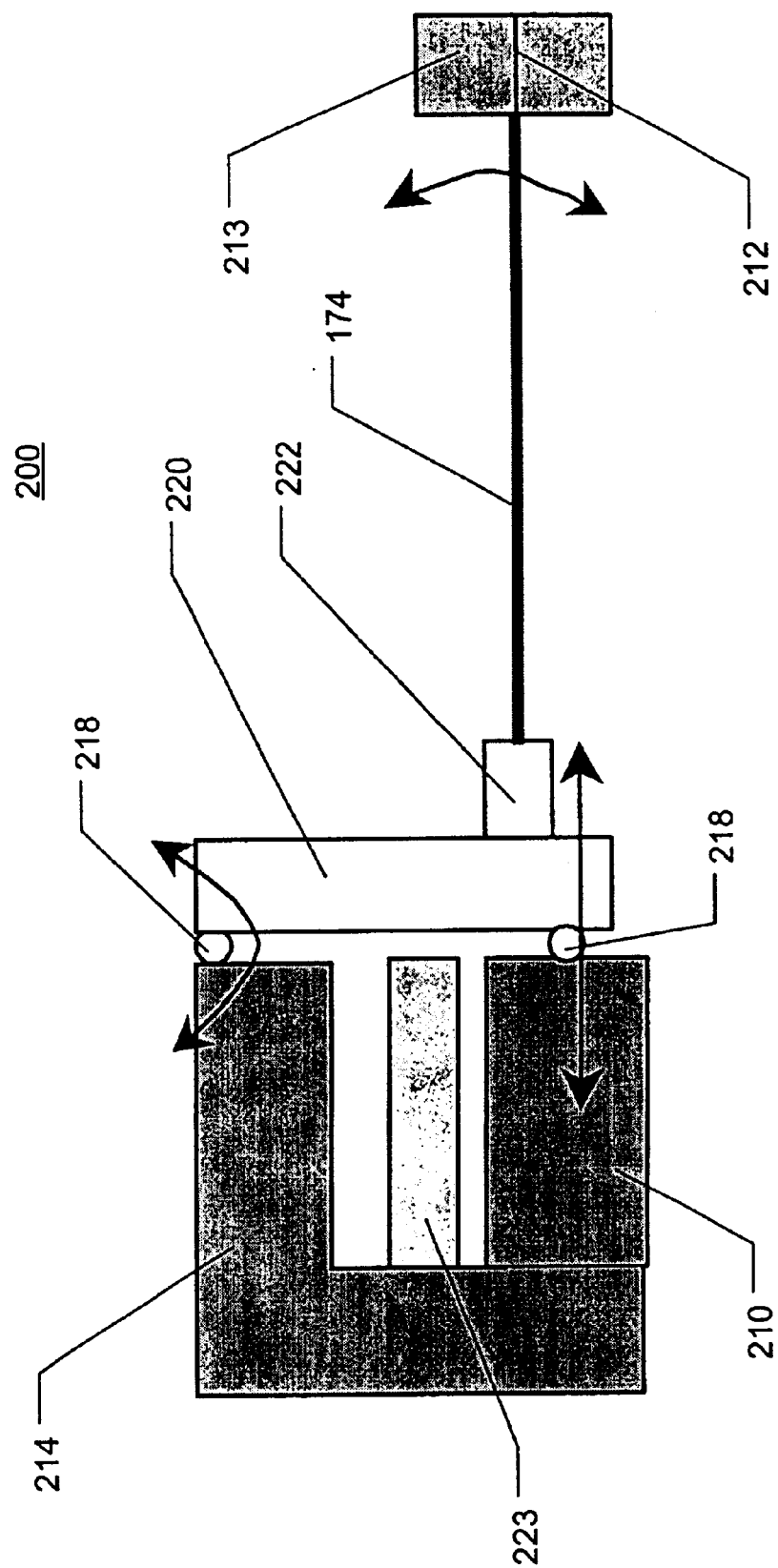
FIG. 15 is a cross-sectional schematic view of a fourth exemplary relaxor actuator motion control system using the generalized closed loop control system of FIG. 4.

It is not necessary for all the components of a system of the present invention to be attached to each other or even physically located in the same place. FIG. 15 is a cross-sectional schematic view of a fourth exemplary relaxor actuator motion control system 200 using the generalized closed loop control system 5 of FIG. 4. This motion control system 200 may be utilized to adjust the direction of a laser 222 to point at a particular target. The system 200 includes an actuator device 210, a base 214, a rigid platform or mount 220 for supporting the laser 222, a pair of ideal hinges 218 for rotatably attaching the mount to the actuator device 210 at one end and to the base 214 at the other end, and a feedback sensor 213 disposed in the desired path of the laser output 225.

The feedback sensor 213 generates one or more feedback signals on the basis of the how the laser output 225 is received. For example, the feedback sensor 213 may be an optical detector that generates one output signal related to the disposition of the laser output 225 on each side of a central target line 212. A further signal, corresponding to the overall intensity of the laser output 225, may be derived by combining the first two output signals. If a purpose of the system 200 is to keep the laser output 225 centered on the optical detector 212, then one or more of the output signals may be used to control the electric field applied to the actuator device 210. The corresponding expansion or contraction of the actuator device 210 then causes the mount 220 to be rotated, thus causing the laser 222 to remain pointed in the desired direction. Significantly, the optical detector 213, may be disposed at a location distant from the laser 222, the actuator device 210 and the like. For example, the laser 222 and its actuator device 210 may be disposed in one satellite (not shown), while the optical detector 213 may be disposed in a second satellite (not shown). The system 200 may thus be used to facilitate inter-satellite communications.

In addition to its other components, the system 200 may further include a displacement sensor 223 for providing information about the relative rotational displacement of the mount 220. The displacement sensor 223 may be mounted on the base 214 adjacent to the mount 220. As the mount 220 is rotated by the actuator device 210, the displacement sensor 223 measures its rotational displacement. Because the mount 220 is rotated in response to feedback from the optical detector 213, the motion of the feedback sensor 213 may be inferred from the motion of the displacement sensor 223 and a knowledge of the length and angle of the laser output 225.

It will therefore be readily understood by those persons skilled in the art that the present invention is susceptible of broad utility and application. Many embodiments and adaptations of the present invention other than those herein described, as well as many variations, modifications and equivalent arrangements, will be apparent from or reasonably suggested by the present invention and the foregoing description thereof, without departing from the substance or scope of the present invention. Accordingly, while the present invention has been described herein in detail in relation to its preferred embodiments, it is to be understood that this disclosure is only illustrative and exemplary of the present invention and is made merely for purposes of providing a full and enabling disclosure of the invention. The foregoing disclosure is not intended, nor is it to be construed, to limit the present invention or otherwise to exclude any other embodiments, adaptations, variations, modifications and equivalent arrangements, the present invention being limited only by the claims appended hereto and the equivalents thereof.

What is claimed is:

1. An electromechanical actuator system comprising:
   at least one actuator device having an actuator body formed from a relaxor-based piezoelectric material and a mechanical system driven by the actuator body;
   a sensor for sensing a phenomenon produced by the mechanical system in response to piezoelectric movement of the actuator body; and
   a driver, having an input connected to the sensor, for applying a variable electric field to the actuator body.

2. The electromechanical actuator system of claim 1, wherein the sensor produces an output corresponding to the phenomenon produced by the mechanical system, and wherein the driver applies the electric field in response to the sensor output.

3. The electromechanical actuator system of claim 2, wherein piezoelectric movement of the actuator body causes a first surface to move relative to a second surface, wherein the sensor measures the separation between the first and second surfaces, and wherein the output of the sensor is a function of the separation measurement.

4. The electromechanical actuator system of claim 3, wherein the sensor measures the separation between a point on the first surface and a point on the second surface.

5. The electromechanical actuator system of claim 3, wherein the first surface defines a first plane and the second surface defines a second plane, and wherein the sensor measures the separation between the first plane and the second plane.

6. The electromechanical actuator system of claim 3, wherein the piezoelectric movement of the actuator body defines a direction of movement, and wherein the direction of movement intersects the first and second surfaces.

7. The electromechanical actuator system of claim 6, wherein the actuator body defines a central axis parallel to the direction of piezoelectric movement, and wherein the central axis intersects the first and second surfaces.

8. The electromechanical actuator system of claim 3, wherein the magnitude of the piezoelectric movement of the actuator body is substantially equivalent to the magnitude of change caused by the piezoelectric movement in the separation between the first and second surfaces.

9. The electromechanical actuator system of claim 3, wherein the sensor is disposed generally adjacent to the actuator body.

10. The electromechanical actuator system of claim 3, wherein the mechanical system includes a first moving member in direct physical contact with the actuator body, wherein the area of contact generally defines a first location in the mechanical system, and wherein the movement of the first surface relative to the second surface occurs in a second location in the mechanical system.

11. The electromechanical actuator system of claim 10, wherein the mechanical system includes a lever, and wherein the movement of the first surface relative to the second surface is transmitted from the actuator body via the lever.

12. The electromechanical actuator system of claim 2, wherein the phenomenon produced by the mechanical system is a displacement.

13. The electromechanical actuator system of claim 12, wherein the displacement is the displacement of at least a portion of the mechanical system.

14. The electromechanical actuator system of claim 12, wherein the displacement is a linear displacement.

15. The electromechanical actuator system of claim 12, wherein the displacement is a rotational displacement.

16. The electromechanical actuator system of claim 2, wherein the sensor is a proximity probe.

17. The electromechanical actuator system of claim 2, wherein the sensor is a strain gage.

18. The electromechanical actuator system of claim 2, wherein the sensor detects a phenomenon other than displacement.

19. The electromechanical actuator system of claim 2, further comprising a comparator for comparing the sensor output to a signal representing a desired state.

20. The electromechanical actuator system of claim 2, further comprising a controller for controlling the driver to variably apply the electric field to the actuator body.

21. The electromechanical actuator system of claim 20, wherein the controller controls the driver in response to the output produced by the sensor.

22. The electromechanical actuator system of claim 20, further comprising at least a second driver for applying a variable electric field to the actuator body.

23. The electromechanical actuator system of claim 22, wherein the controller also controls the second driver to variably apply an electric field to the actuator body.

24. The electromechanical actuator system of claim 22, further comprising a second controller for controlling the second driver to variably apply the electric field to the actuator body.

25. The electromechanical actuator system of claim 2, further comprising at least a second sensor for sensing a second phenomenon produced by the mechanical system in response to the piezoelectric movement of the actuator body, wherein the second sensor produces an output corresponding to the second phenomenon produced by the mechanical system.

26. The electromechanical actuator system of claim 25, wherein the driver applies the electric field in response to the second sensor output.

27. The electromechanical actuator system of claim 25, wherein at least one sensor is a displacement sensor and at least one sensor is not a displacement sensor.

28. The electromechanical actuator system of claim 27, wherein the first sensor is not a displacement sensor and the second sensor is a displacement sensor, and wherein the second phenomenon is a displacement caused by the piezoelectric movement of the actuator body in response to the output of the first sensor.

29. The electromechanical actuator system of claim 25, wherein at least two sensors are displacement sensors.

30. The electromechanical actuator system of claim 2, further comprising a first support structure and a second support structure, wherein the actuator body is supported by the first support structure and the sensor is supported by the second support structure, and wherein the first and second support structures are structurally independent of each other.

31. The electromechanical actuator system of claim 1, wherein the relaxor-based piezoelectric material is a relaxor ferroelectric material.

32. The electromechanical actuator system of claim 1, wherein the relaxor-based piezoelectric material is PMN, PZN, a solid solution of PMN and PT, or a solid solution of PZN and PT.

33. The electromechanical actuator system of claim 32, wherein PT is 8% of the solid solution of PZN and PT.

34. The electromechanical actuator system of claim 32, wherein PT is 4.5% of the solid solution of PZN and PT.

35. The electromechanical actuator system of claim 32, wherein PT is 24% of the solid solution of PMN and PT.

36. The electromechanical actuator system of claim 1, wherein the actuator body is rectilinear in shape.

37. The electromechanical actuator system of claim 1, wherein the actuator body is curvilinear in shape.

38. The electromechanical actuator system of claim 1, wherein the actuator body is formed from at least two bi-morph elements.

39. A method of controlling an electromechanical actuator system, the method comprising the steps of:
applying an electric field to an actuator body formed from a relaxor-based material to generate a piezoelectric movement in the actuator body;
in response to the piezoelectric movement of the actuator body, producing a phenomenon in a mechanical system;
sensing the phenomenon produced by the mechanical system; and
varying the applied electric field according to the outcome of the sensing step.

40. The method of claim 39, further comprising the step of generating an output signal corresponding to the phenomenon produced by the mechanical system.

41. The method of claim 40, further comprising the step of comparing the output signal to a signal representing a desired state.

42. The method of claim 41, wherein the step of varying the applied electric field is carried out according to the outcome of the comparing step.

43. The method of claim 39, wherein the step of producing a phenomenon includes causing a first surface to move relative to a second surface, and wherein the step of sensing includes measuring the separation between the first and second surfaces.

44. The method of claim 43, wherein the step of causing a first surface to move relative to a second surface includes causing the first surface to move in a first direction defining an axis, and wherein the axis intersects the first and second surfaces.

45. The method of claim 43, wherein the magnitude of the piezoelectric movement of the actuator body is substantially equivalent to the magnitude of change caused by the piezoelectric movement in the separation between the first and second surfaces.

46. The method of claim 43, wherein the sensing step is carried out in a location generally adjacent to the actuator body.

47. The method of claim 43, wherein the step of producing a phenomenon in the mechanical system includes physically contacting a first moving member of the mechanical system with the actuator body, wherein the area of physical contact between the first moving member and the actuator body generally defines a first location in the mechanical system, and wherein the movement of the first surface relative to the second surface occurs in a second location in the mechanical system.

48. The method of claim 47, wherein the mechanical system includes a lever, and wherein the step of causing movement of the first surface relative to the second surface includes transmitting movement from the actuator body via the lever.

49. The method of claim 39, wherein the step of producing a phenomenon includes producing a displacement of at least a portion of the mechanical system.

50. The method of claim 47, wherein the step of producing a displacement includes producing a linear displacement.

51. The method of claim 47, wherein the step of producing a displacement includes producing a rotational displacement.

52. The method of claim 47, wherein the step of sensing includes sensing the proximity of a surface to the tip of a proximity probe.

53. The method of claim 47, wherein the step of sensing includes measuring strain.

54. The method of claim 47, wherein the step of sensing includes detecting a phenomenon other than displacement.

55. An electromechanical actuator system, comprising:
- an actuator device having an actuator body formed from a relaxor-based piezoelectric material and a mechanical system driven by the actuator body;
- a driver for variably applying an electric field to the actuator body; and
- a feedback loop for providing input to the driver in response to at least one phenomenon produced by the mechanical system.

56. The electromechanical actuator system of claim 55, wherein the phenomenon produced by the mechanical system is in response to piezoelectric movement of the actuator body, and wherein the driver applies the electric field in response to the input from the feedback loop.

57. The electromechanical actuator system of claim 56, wherein piezoelectric movement of the actuator body causes a first surface to move relative to a second surface, and wherein the feedback loop provides input to the driver regarding the separation between the first and second surfaces.

58. The electromechanical actuator system of claim 57, wherein the input provided regarding the separation between the first and second surfaces is based on a measurement of the separation between the first and second surfaces.

59. The electromechanical actuator system of claim 57, wherein the piezoelectric movement of the actuator body defines a direction of movement, and wherein the direction of movement intersects the first and second surfaces.

60. The electromechanical actuator system of claim 57, wherein the mechanical system includes a first moving member in direct physical contact with the actuator body, wherein the area of contact generally defines a first location in the mechanical system, and wherein the movement of the first surface relative to the second surface occurs in a second location in the mechanical system.

61. The electromechanical actuator system of claim 60, wherein the mechanical system includes a lever, and wherein the movement of the first surface relative to the second surface is transmitted from the actuator body via the lever.

62. The electromechanical actuator system of claim 56, wherein the phenomenon produced by the mechanical system is a displacement of at least a portion of the mechanical system.

63. The electromechanical actuator system of claim 56, wherein the feedback loop provides input to the driver regarding a phenomenon other than displacement.

64. The electromechanical actuator system of claim 56, further comprising a comparator for comparing input from the feedback loop to a signal representing a desired state.

65. The electromechanical actuator system of claim 56, further comprising a controller for controlling the driver to variably apply the electric field to the actuator body in response to the input from the feedback loop.

66. The electromechanical actuator system of claim 65, further comprising at least a second driver for applying a variable electric field to the actuator body.

67. The electromechanical actuator system of claim 56, wherein the feedback loop further provides input to the driver in response to at least a second phenomenon produced by the mechanical system, and wherein the second phenomenon is produced in response to piezoelectric movement of the actuator body.

* * * * *